(12) United States Patent
Inoue et al.

(10) Patent No.: US 10,559,778 B2
(45) Date of Patent: Feb. 11, 2020

(54) COMPOSITE GAS BARRIER LAMINATE AND METHOD FOR PRODUCING SAME

(71) Applicant: ZEON CORPORATION, Tokyo (JP)

(72) Inventors: Hiroyasu Inoue, Tokyo (JP); Atsushi Ishiguro, Tokyo (JP); Yohei Koide, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 0 days.

(21) Appl. No.: 15/112,746

(22) PCT Filed: Jan. 23, 2015

(86) PCT No.: PCT/JP2015/051920
§ 371 (c)(1),
(2) Date: Jul. 20, 2016

(87) PCT Pub. No.: WO2015/115337
PCT Pub. Date: Aug. 6, 2015

(65) Prior Publication Data
US 2016/0343986 A1    Nov. 24, 2016

(30) Foreign Application Priority Data

Jan. 29, 2014   (JP) .................................. 2014-014678

(51) Int. Cl.
*H01L 51/52*       (2006.01)
*B32B 27/32*       (2006.01)
(Continued)

(52) U.S. Cl.
CPC ............ *H01L 51/5253* (2013.01); *B32B 7/02* (2013.01); *B32B 7/12* (2013.01); *B32B 25/08* (2013.01);
(Continued)

(58) Field of Classification Search
CPC ...... H01L 51/5253; B32B 27/08; B32B 27/32
(Continued)

(56) References Cited

U.S. PATENT DOCUMENTS 5,700,874 A * 12/1997 Takeichi .................. C08F 8/42
  525/250
6,197,889 B1 * 3/2001 Knoll ..................... C08F 297/04
  525/314
(Continued)

FOREIGN PATENT DOCUMENTS

CN       102458840 A    5/2012
EP        1768463 A1    3/2007
(Continued)

OTHER PUBLICATIONS

Machine_English_translation_JP_2011201043_A1; Inoue, Hiroyasu; Gas Barrier Laminate and Surface Light Source Device; Oct. 13, 2011; whole document.*
(Continued)

*Primary Examiner* — Tahseen Khan
(74) *Attorney, Agent, or Firm* — Oliff PLC

(57) ABSTRACT

A composite gas barrier layered body for an organic electroluminescent light-emitting element, including: a gas barrier layered body (A) having a film (a) of an alicyclic polyolefin resin and one or more inorganic barrier layers (a) directly provided on at least one surface of the film (a); a film (b) formed of an alicyclic polyolefin resin having a thickness that is equal to or less than a thickness of the film (a); and a heat-melting layer that is interposed between the inorganic barrier layer (a) and the film (b) to bond the inorganic barrier layer (a) to the film (b), wherein a glass transition temperature of the heat-melting layer is lower than a glass transition
(Continued)

temperature of the alicyclic polyolefin resin constituting the film (a) and the film (b) by 25° C. or more; and production method therefor.

9 Claims, 2 Drawing Sheets

(51) Int. Cl.
    *B32B 27/08* (2006.01)
    *B32B 27/30* (2006.01)
    *B32B 25/08* (2006.01)
    *B32B 7/02* (2019.01)
    *B32B 7/12* (2006.01)
    *B32B 27/12* (2006.01)

(52) U.S. Cl.
    CPC .............. *B32B 27/08* (2013.01); *B32B 27/12* (2013.01); *B32B 27/302* (2013.01); *B32B 27/32* (2013.01); *B32B 27/325* (2013.01); *H01L 51/5281* (2013.01); *B32B 2255/10* (2013.01); *B32B 2255/20* (2013.01); *B32B 2274/00* (2013.01); *B32B 2307/30* (2013.01); *B32B 2307/544* (2013.01); *B32B 2307/546* (2013.01); *B32B 2307/7242* (2013.01); *B32B 2307/732* (2013.01); *B32B 2457/206* (2013.01)

(58) Field of Classification Search
    USPC ........................................................ 428/215
    See application file for complete search history.

(56) References Cited

U.S. PATENT DOCUMENTS

| | | | | |
|---|---|---|---|---|
| 6,245,437 | B1* | 6/2001 | Shiiki | B32B 27/08 428/36.6 |
| 9,076,986 | B2* | 7/2015 | Tsuburaya | B32B 27/08 |
| 2003/0100683 | A1* | 5/2003 | Toyoizumi | C08C 19/02 525/331.9 |
| 2007/0148443 | A1* | 6/2007 | Blum | C09J 5/08 428/343 |
| 2007/0241673 | A1 | 10/2007 | Yamada et al. | |
| 2008/0138613 | A1* | 6/2008 | Tanaka | B32B 17/10018 428/337 |
| 2009/0061223 | A1* | 3/2009 | Tsukahara | B32B 7/12 428/349 |
| 2010/0331465 | A1* | 12/2010 | Zhao | C08L 53/025 524/261 |
| 2012/0064318 | A1 | 3/2012 | Keite-Telgenbuscher et al. | |
| 2012/0171498 | A1* | 7/2012 | Hatta | B32B 17/10 428/441 |
| 2012/0326599 | A1 | 12/2012 | Yamada et al. | |
| 2013/0021667 | A1* | 1/2013 | Tsuburaya | B32B 27/08 359/489.07 |

FOREIGN PATENT DOCUMENTS

| | | |
|---|---|---|
| EP | 2033988 A2 | 3/2009 |
| JP | H03-63127 A | 3/1991 |
| JP | 2005-327687 A | 11/2005 |
| JP | 2009-190186 A | 8/2009 |
| JP | 2011201043 A1 * | 10/2011 |
| WO | WO2011118661 A * | 9/2011 |

OTHER PUBLICATIONS

Apr. 14, 2015 Search Report issued in International Patent Application No. PCT/JP2015/051920.
Sep. 22, 2017 extended Search Report issued in Application No. 15743500.9.
Oct. 11, 2018 Office Action issued in European Application No. 15743500.9.

* cited by examiner

COMPOSITE GAS BARRIER LAMINATE AND METHOD FOR PRODUCING SAME

FIELD

The present invention relates to a composite gas barrier layered body and a method for producing the same.

BACKGROUND

An organic electroluminescent element (hereinbelow sometimes referred to as "organic EL element" or simply "element" as appropriate) may be provided with a member having gas barrier property to prevent water vapor and oxygen from entering inside the element. In particular, the member is required to have excellent gas barrier property since, when an organic material inside the organic EL element is deteriorated by water vapor and oxygen, the performance of the element may be largely lowered.

As such a member, e.g., a member having an inorganic layer has been known (see, e.g., Patent Literature 1). In general, the inorganic layer has an excellent ability of blocking water vapor and oxygen, and gas barrier property can thus be achieved by provision of the inorganic layer. When the thickness of the inorganic layer is increased, higher gas barrier property can be expected. For example, Patent Literature 2 proposes a high barrier plastic in which films formed of silicon oxide are bonded to each other, and Patent Literature 3 proposes a gas barrier layered, body having a plurality of inorganic layers.

CITATION LIST

Patent Literature

Patent Literature 1: Japanese Patent Application Laid-Open No. 2005-327687 A (corresponding foreign publication: European Patent Application Publication No. 1768463)
Patent Literature 2: Japanese Patent Application Laid-Open No. Hei. 03-063127 A
Patent Literature 3: Japanese Patent Application Laid-Open No. 2009-190186 A

SUMMARY

Technical Problem

However, a gas barrier layered body having an inorganic layer causes curling (warping) when the thickness of the inorganic layer is large. The curling is considered to be due to the difference in thermal expansion coefficient between the inorganic layer and layers other than the inorganic layer in the gas barrier layered body. Specifically, when a temperature changes during production or use of the gas barrier layered body, the inorganic layer and the layers other than the inorganic layer cause expansion or shrinkage in respective different degrees. It is considered that these different degrees cause the gas barrier layered body to be warped. This will be described with reference to a specific example. For example, for a gas barrier layered body having an inorganic layer on a resin film, a step of forming the inorganic layer on the resin film is usually performed under a high-temperature environment, and a resultant gas barrier layered body is then cooled. At that time, since the inorganic layer and the resin film are usually different in thermal expansion coefficient, the resin film largely shrinks by cooling as compared with the inorganic layer. Consequently, the gas barrier layered body is often curled with the inorganic layer being outside and the resin film being inside. In particular, in order to achieve a water vapor barrier property of $2\times10^{-2}$ g/m$^2$·day or less, a sufficiently thick inorganic layer is desired. As a result of this, the gas barrier layered body is largely curled. When the gas barrier layered body is largely curled, the handleability of the gas barrier layered body is reduced. That increases difficulty in mounting the gas barrier layered body on an organic EL element. Accordingly, development of a gas barrier layered body configuration that alleviates curling has been demanded.

A configuration like Patent Literature 2 can alleviate curling, but has problems of an increase in a gas component generated from an adhesive and loss of bendable property due to use of an energy curable adhesive.

In particular, in use of the gas barrier layered body, outgas (gas generated from the gas barrier layered body) reduces the production efficiency during production of the element and causes defects such as a dark spot during production and use of the element. Therefore, a sufficient decrease of generation of such outgas is desired.

Further, the gas barrier layered body is desired to prevent a reduction in gas barrier property under a high-temperature environment and a deterioration of the gas barrier property due to easy generation of a crack. This is for suppressing a reduction in the gas barrier property of the gas barrier layered body during, e.g., use, storage, and transportation, to favorably maintain the gas barrier property. Accordingly, the gas barrier layered body is desired to have excellent bendable property and to cause a suppressed reduction in the gas barrier performance caused by bending.

Consequently, it is an object of the present invention to provide a composite gas barrier layered body that generates less outgas, has excellent bendable property, causes a suppressed reduction in the gas barrier performance during bending, and causes less curling, and a method for producing the same.

Solution to Problem

The present inventor has conducted studies to solve the problems. As a result, the inventor has conceived a configuration of a composite gas barrier layered body having a plurality of films of an alicyclic polyolefin resin having different thicknesses, and an inorganic barrier layer and a hot-melting layer that are disposed in a specific manner between the films. Further, the present inventor has found out that such a composite gas barrier layered body also has effects such as a decrease in generation of outgas, improved bendable property, and durability against bending, in addition to alleviation of curling. The present invention has been completed on the basis of the findings described above.

Accordingly, the present invention is as follows.

(1) A composite gas barrier layered body for an organic electroluminescent light-emitting element, comprising:

a gas barrier layered body (A) having a film (a) of an alicyclic polyolefin resin and one or more inorganic barrier layers (a) directly provided on at least one surface of the film (a);

a film (b) formed of an alicyclic polyolefin resin having a thickness that is equal to or less than a thickness of the film (a); and a heat-melting layer that is interposed between the inorganic barrier layer (a) and the film (b) to bond the inorganic barrier layer (a) to the film (b), wherein a difference (TgB−TgA) between a glass transition temperature TgA of the heat-melting layer and a glass transition temperature TgB of the alicyclic polyolefin resin constituting the film (a) and the film (b) is 25° C. or higher.

(2) The composite gas barrier layered body according to (1), wherein the heat-melting layer is a layer of a styrene-based thermoplastic elastomer resin.

(3) The composite gas barrier layered body according to (2), wherein the styrene-based thermoplastic elastomer resin contains a styrene-conjugated diene block copolymer hydride.

(4) The composite gas barrier layered body according to any one of (1) to (3), wherein any one of the film (a) and the film (b) has a retardation in an in-plane direction at a wavelength of 550 nm of 115 to 160 nm, and the other has a retardation in an in-plane direction at a wavelength of 550 nm of 0 to 25 nm.

(5) The composite gas barrier layered body according to any one of (1) to (4), wherein the film (b) has a thickness of 30 μm or less, and the composite gas barrier layered body has a thickness of 100 μm or less.

(6) A method for producing a composite gas barrier layered body, comprising steps of:

forming an inorganic barrier layer (a) directly on at least one surface of a film (a) of an alicyclic polyolefin resin to obtain a gas barrier layered body (A); and stacking the gas barrier layered body (A), a film (b) of an alicyclic polyolefin resin having a thickness that is equal to or less than a thickness of the film (a), and a film (c) of a heat-melting resin so that the film (a), the inorganic barrier layer (a), the film (c), and the film (b) are stacked in this order, and thermally compression-bonding the stack, wherein a difference (TgB−TgA) between a glass transition temperature TgA of the heat-melting resin and a glass transition temperature TgB of the alicyclic polyolefin resin constituting the film (a) and the film (b) is 25° C. or higher.

Advantageous Effects of Invention

The present invention can provide a composite gas barrier layered body that generates less outgas, has excellent bendable property, causes a suppressed reduction in the gas barrier performance during bending, and causes less curling, and a method for producing the same.

DESCRIPTION OF EMBODIMENTS

Hereinbelow, the present invention will be described in detail by referring to embodiments and examples. However, the present invention is not limited to the following embodiments and examples. The present invention may be optionally modified for implementation within the scope not departing from the claims of the present invention and equivalents thereto.

In the following description, an expression "long-length" of a film means that the film has a length of at least 5 times or more a width, and preferably 10 times or more the width, and specifically means a length capable of being wound up into a roll shape for storage or transportation. The upper limit of a ratio of the length relative to the width is not particularly limited, and may be usually 5,000 or less.

In the following description, a "polarizing plate" and a "¼ wave plate" include not only a rigid member, but also a flexible member such as a film made of a resin unless otherwise specified.

In the following description, an in-plane retardation of a film is a value represented by (nx−ny)×d. Herein, nx represents a refractive index in a direction perpendicular to the thickness direction of the film (in-plane direction) that gives the largest refractive index. ny represents a refractive index in an in-plane direction of the film that is orthogonal to the direction of nx. d represents the thickness of the film. The retardation may be measured by a commercially available spectroscopic ellipsometer (for example, M-2000U manufactured by J. A. Woollam Japan) or the like. The measurement wavelength of the in-plane retardation is 550 nm unless otherwise specified.

[1. Summary of Composite Gas Barrier Layered Body]

Figure 1:
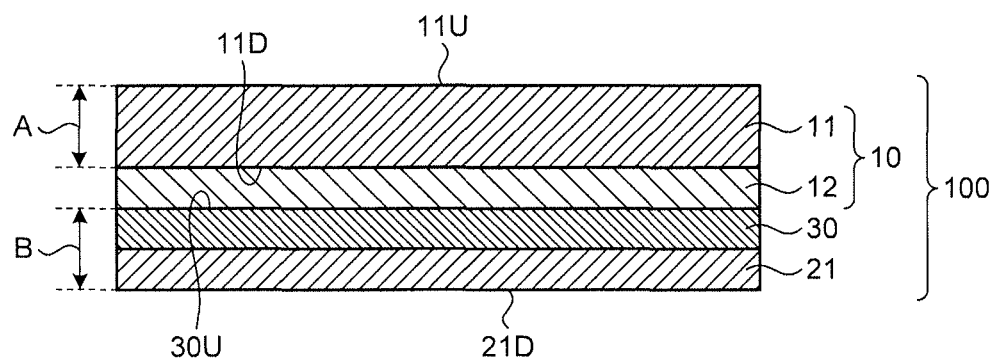
FIG. 1 is a cross-sectional view schematically illustrating a cross section of a composite gas barrier layered body according to an embodiment of the present invention, the cross section being obtained by cutting along a plane perpendicular to a principal plane of the layered body.

FIG. 1 is a cross-sectional view schematically illustrating a cross section of a composite gas barrier layered body 100 according to an embodiment of the present invention, the cross section being obtained by cutting along a plane perpendicular to a principal plane of the layered body. In the example shown in FIG. 1, the composite gas barrier layered body 100 is a layered body in which a gas barrier layered body (A) 10 having a film (a) 11 and an inorganic barrier layer (a) 12 and a film (b) 21 are thermally compression-bonded via a heat-melting layer 30 so that the inorganic barrier layer (a) 12 and the film (b) 21 face to each other. Therefore, the composite gas barrier layered body 100 has the film (a) 11, the inorganic barrier layer (a) 12, the heat-melting layer 30, and the film (b) 21 in this order.

[2. Gas Barrier Layered Body (A)]

The composite gas barrier layered body of the present invention has a gas barrier layered body (A) having a film (a) of an alicyclic polyolefin resin and one or more inorganic barrier layers (a) provided directly on at least one surface of the film (a). In the example shown in FIG. 1, the gas barrier layered body (A) 10 has the film (a) 11 and the inorganic barrier layer (a) 12 that is formed on one surface 11D of the film (a) 11. The film (a) 11 is in direct contact with the inorganic barrier layer (a) 12.

[2.1. Film (a)]

The film (a) is a film of an alicyclic polyolefin resin. The alicyclic polyolefin resin herein is a resin containing an alicyclic olefin polymer and if necessary, an optional component other than the polymer. The alicyclic polyolefin resin has low water vapor permeability and generates less outgas. Therefore, in a process including reducing of a pressure in a system (for example, vapor deposition and sputtering) for formation of the inorganic barrier layer (a), the amount of outgas emitted from the film to the pressure-reducing system is small. Consequently, by the employment of the film of the alicyclic polyolefin resin as the film (a), favorable inorganic barrier layer (a) can be formed. As a result, the gas barrier property of the composite gas barrier layered body can be enhanced. The amount of outgas emitted during pressure reduction in use of the composite gas barrier layered body of the present invention for production of an element is also small, and the amount of outgas emitted to the element in use of the element is also small. Therefore, a high-quality element can be easily produced. A film produced by melt-extruding the alicyclic polyolefin resin has favorable surface smoothness, and convex portions thereon that may cause crack of the inorganic layer is small. Therefore, the water vapor permeability can be decreased as compared with a film having poor surface smoothness even when the inorganic layer is thin. Accordingly, the productivity and the bendable property are excellent. Further, the film (a) is usually a substrate that supports the inorganic barrier layer (a) and also exerts an effect of maintaining the strength of the gas barrier layered body (A).

The alicyclic olefin polymer is an amorphous thermoplastic polymer having an alicyclic structure in a main chain and/or a side chain. Examples of the alicyclic structure in the alicyclic olefin polymer may include a saturated alicyclic hydrocarbon (cycloalkane) structure and an unsaturated alicyclic hydrocarbon (cycloalkene) structure. The cycloalkane structure is preferable in terms of mechanical strength, heat resistance, and the like. The number of carbon atoms constituting the alicyclic structure is not specifically limited. The number of carbon atoms is usually 4 or more and preferably 5 or more, and is usually 30 or less, preferably 20 or less, and more preferably 15 or less. When the number of carbon atoms constituting the alicyclic structure falls within the range, properties of mechanical strength, heat resistance, and film formability are highly balanced, which is preferable.

The ratio of a structural unit having an alicyclic structure in the alicyclic olefin polymer is preferably 55% by weight or more, more preferably 70% by weight or more, and particularly preferably 90% by weight or more. When the ratio of the structural unit having an alicyclic structure in the alicyclic olefin polymer falls within this range, the polymer is preferable in terms of transparency and heat resistance.

Examples of the alicyclic olefin polymer may include a norbornene polymer, a monocyclic olefin polymer, a cyclic conjugated diene polymer, a vinyl alicyclic hydrocarbon polymer, and hydrides thereof. Among them, a norbornene polymer has a favorable transparency and formability, and therefore may be suitably used.

Examples of the norbornene polymer may include a ring-opening polymer of a monomer having a norbornene structure, a ring-opening copolymer of a monomer having a norbornene structure and another monomer, and hydrides thereof; and an addition polymer of a monomer having a norbornene structure, an addition copolymer of a monomer having a norbornene structure and another monomer, and hydrides thereof. Among them, a ring-opening (co)polymer hydride of a monomer having a norbornene structure may be particularly suitably used in terms of transparency, formability, heat resistance, low hygroscopicity, size stability, lightweight property, and the like.

As the alicyclic olefin polymer, one type of the polymer may be used alone, and two or more types thereof may also be used in combination at any ratio. The film (a) may have a configuration in which various types of alicyclic olefin resins each form a layer.

The molecular weight of the alicyclic olefin polymer contained in the alicyclic olefin resin is appropriately selected in accordance with the intended use. The weight average molecular weight (Mw) of the alicyclic olefin polymer that is measured by gel permeation chromatography using cyclohexane (use of toluene is acceptable when the polymer is not dissolved in cyclohexane) as a solvent in terms of polyisoprene (in terms of polystyrene when the solvent is toluene) is usually 10,000 or more, preferably 15,000 or more, and more preferably 20,000 or more, and is usually 100,000 or less, preferably 80,000 or less, and more preferably 50,000 or less. When the weight average molecular weight thereof falls within such a range, the mechanical strength and forming processability, and the like of the film (a) are highly balanced, which is preferable.

Examples of the optional component that may be contained in the alicyclic polyolefin resin may include additives such as an antioxidant, a thermal stabilizer, a photostabilizer, a ultraviolet absorber, an antistatic agent, a dispersant, a chlorine scavenger agent, a flame retarder, a crystallization nucleating agent, a toughening agent, an anti-blocking agent, an anti-fogging agent, a release agent, a pigment, an organic or inorganic filler, a neutralizer, a lubricant, a decomposer, a metal inactivating agent, an anti-fouling agent, an antibacterial agent, another resin, and a thermoplastic elastomer. One type of the additive may be used alone, and two or more types thereof may also be used in combination at any ratio. The amount of the optional component is usually 0 to 50 parts by weight, and preferably 0 to 30 parts by weight with respect to 100 parts by weight of the polymer contained in the alicyclic polyolefin resin.

The alicyclic polyolefin resin is not necessarily limited to a resin having a high transparency. However, an alicyclic polyolefin resin having a high transparency is preferable from the viewpoint of usefully using the composite gas barrier layered body for a portion required to transmit light in an organic EL element. For example, it is preferable that the total light transmittance of the alicyclic polyolefin resin measured using a test piece having a thickness of 1 mm is usually 70% or more, preferably 80% or more, and more preferably 90% or more.

The thickness of the film (a) is preferably 10 μm or more, and more preferably 30 μm or more, and is preferably 300 μm or less, more preferably 100 μm or less, and particularly preferably 50 μm or less. The thickness of the film (a) may be measured by a contact-type film thickness meter. Specifically, the thickness is measured at 10 points equally spaced on a line parallel to a TD direction, and an average value thereof is calculated. This value may be adopted as a measured value of the thickness.

The thermal expansion coefficient of the film (a) is preferably 70 ppm/K or less, more preferably 50 ppm/K or less, and further preferably 40 ppm/K or less. Such a thermal expansion coefficient may be determined by measuring elongation of the length of the film (a) as a test piece of 20 mm×5 mm when the temperature is increased from 30° C. to 130° C. under conditions of a load of 5.0 g, a nitrogen of 100 cc/min, and a temperature increasing rate of 0.5° C./min.

The humidity expansion coefficient of the film (a) is preferably 30 ppm/% RH or less, more preferably 10 ppm/% RH or less, and further preferably 1.0 ppm/% RH or less. Such a humidity expansion coefficient may be determined by measuring elongation of the length of the film as a test peace of 20 mm×5 mm when the humidity is increased from 30% RH to 80% RH under conditions of a load of 5.0 g, a nitrogen of 100 cc/min, a temperature of 25° C., and a rate of 5.0% RH/min.

The glass transition temperature of the film (a) is preferably 110° C. or higher, more preferably 130° C. or higher, and particularly preferably 160° C. or higher. When the glass transition temperature is high, thermal shrinkage of the film (a) before and after thermal history such as a high-temperature environment can be suppressed. When the glass transition temperature is high, thermal compression-bonding can be performed without undesired variation of Re in production of the composite gas barrier layered body.

As a result of achieving such preferable thermal expansion coefficient, humidity expansion coefficient, and glass transition temperature, the composite gas barrier layered body in which a reduction in gas barrier property under a high-temperature and high-humidity environment is suppressed can be obtained.

On a surface of the film (a) opposite to the inorganic barrier layer (a) (surface 11U in FIG. 1), a concavo-convex structure may be formed. By the provision of the concavo-convex structure, tendency to cause blocking of the film (a) is reduced. For example, when the composite gas barrier layered body is produced using a long-length film (a) by a roll-to-roll method, the film (a) can be easily unrolled from a roll. Therefore, production can be facilitated. The surface of the film (a) opposite to the inorganic barrier layer (a) is usually the outermost surface of the composite gas barrier layered body. When the concavo-convex structure is formed on the surface of the film (a) opposite to the inorganic barrier layer (a), the composite gas barrier layered body has the concavo-convex structure on the outermost surface thereof. Therefore, blocking of the composite gas barrier layered body can be suppressed. On a surface of the film (b) opposite to the film (a) (surface 21D in FIG. 1) in place of or in addition to the surface of the film (a), the concavo-convex structure may be formed.

The arithmetic average roughness Ra (JIS B601-2001) of the surface having the concavo-convex structure is preferably 0.02 μm or more, more preferably 0.1 μm or more, and particularly preferably 3 μm or more. When the arithmetic average roughness Ra is equal to or more than the lower limit of the range, the surface having the concavo-convex structure has favorable slidability and blocking can be stably prevented. The upper limit of the arithmetic average roughness is not particularly limited, but is preferably 50 μm or less, more preferably 25 μm or less, and particularly preferably 10 μm or less.

The method for producing the film (a) is not particularly limited. For example, any of a melt molding method and a solution casting method may be used. For example, the melt molding method may be specifically classified into an extrusion molding method, a press molding method, an inflation molding method, an injection molding method, a blow molding method, and a stretch molding method. Among these methods, the extrusion molding method, the inflation molding method, and the press molding method are preferable since the film (a) that has excellent mechanical strength and surface precision can be obtained, and the extrusion molding method is particularly preferable in terms of efficient and simple production of the film (a).

In the method for producing the film (a), e.g., a stretching step of stretching a film may be performed. Thus, a stretched film can be obtained as the film (a). When the stretched film is used as the film (a), the thermal expansion coefficient of the film (a) can be suppressed, and degradation of gas barrier performance under a high-temperature and high-humidity environment can be further reduced. Such a stretched film can be obtained by, e.g., molding an alicyclic polyolefin resin into a raw film through the above-described method and stretching the raw film.

The shape of the raw film may be appropriately set so that the film (a) having a desired size is obtainable by a desired stretching ratio. The shape is preferably a long-length film shape. The expression "long-length" herein means that a length is at least 5 times or more longer than a width, and preferably 10 times or more longer than the width, and specifically means a length capable of being wound up into a roll shape for storage or transportation.

The mode of stretching may be preferably biaxial stretching. Such biaxial stretching may be performed by stretching the raw film in two directions that are parallel to the surface of the film and perpendicular to each other. Herein, the directions that are "perpendicular" preferably form an angle of 90°, and the angle may further include instances having a tolerance of about ±10°.

Usually, the two directions that are perpendicular to each other are set along the MD direction of the long-length raw film (a flowing direction of the raw film, that is, a lengthwise direction of the long-length raw film) and the TD direction (a widthwise direction of the raw film that is perpendicular to the MD direction), respectively. However, the two directions are not limited to these directions. The two directions may be two directions that are perpendicular to each other and diagonal to the MD and TD directions.

The mode of biaxial stretching may be sequential biaxial stretching (respective stretching steps in two directions are performed as separate steps) or simultaneous biaxial stretching (at least parts of the respective stretching steps in two directions are simultaneously performed). In terms of production efficiency, the simultaneous biaxial stretching is preferable. When each of the stretching steps in two directions is required to be controlled independently and precisely such as in a case wherein a phase difference value of the film (a) is required to be as low as possible, the sequential biaxial stretching may be preferable in terms of facilitation of the control.

The stretching ratio of the biaxial stretching in each of two directions is preferably 1.05 times or more and more preferably 1.5 times or more, and is preferably 4.5 times or less and more preferably 3.5 times or less. It is preferable that the ratio of the stretching ratios in the two directions falls within a range of 1:1 to 2:1, in order to minimize a change in moisture permeability under a high-temperature and high-humidity environment and to realize uniform light transmission through the composite gas barrier layered body.

The temperature during the biaxial stretching may be set on the basis of the glass transition temperature Tg of the alicyclic polyolefin resin that forms the raw film. The temperature range during the biaxial stretching is preferably Tg or higher, and is Tg+30° C. or lower, and more preferably Tg+20° C. or lower. When the raw film has layers of a plurality of types of alicyclic polyolefin resins each having a different glass transition temperature, the temperature range during the biaxial stretching may be set on the basis of the lowest glass transition temperature of the alicyclic polyolefin resins.

Preferred examples of a device used for the biaxial stretching may include a tenter stretching machine, and other stretching machines provided with guide rails and grippers that move along the guide rails. In addition, any stretching machine such as a lengthwise uniaxial stretching machine, a bubble stretching machine, and a roller stretching machine may also be used.

When a concavo-convex structure is formed on the surface of the film (a), the method of forming the concavo-convex structure is not limited. Examples of the method of forming a concavo-convex structure may include a nip molding method in which the film (a) is pressed using a shaping roller having a concavo-convex structure on the surface thereof to transfer the concavo-convex structure to the surface of the film (a); a method in which the film (a) is nipped by a release film having a concavo-convex structure on the surface thereof to transfer the concavo-convex structure of the release film to the film (a), and the release film is then separated from the film (a); a method in which particles are sprayed to the surface of the film (a) to cut the surface of the film (a); and a method in which an electron beam-curable resin is disposed on the surface of the film (a) and then cured to form a concavo-convex structure. Further, a concavo-convex structure may be formed by adjusting a composition of the film (a). Examples thereof may include a method of forming a concavo-convex structure by using the alicyclic polyolefin resin that includes particles with a predetermined particle diameter to form the film (a); and a method of forming a concavo-convex structure by adjusting a mixing ratio of components in the alicyclic polyolefin resin that forms the film (a).

Usually, blocking of the film (a) is prone to occur prior to the formation of the inorganic barrier layer (a) on the surface of the film (a). Therefore, in terms of prevention of blocking, it is preferable that a step of forming a concavo-convex structure on the surface of the film (a) is performed prior to a step of forming the inorganic barrier layer (a) on the surface of the film (a).

[2.2. Inorganic Barrier Layer (a)]

The inorganic barrier layer (a) is a layer that is formed of an inorganic material, and that has a barrier ability against a component that is present in the outside air and may deteriorate a component inside a device such as a display device and a light-emitting device (for example, a light-emitting layer in an organic EL element), such as moisture and oxygen. The inorganic barrier layer (a) exerts a barrier effect against transmission of the component such as moisture and oxygen from one of front and back surfaces of the gas barrier layered body (A) to the other surface.

Since the inorganic barrier layer (a) in the composite gas barrier layered body is located inside the film (a), damage of the inorganic barrier layer (a) due to external force can be prevented. Therefore, the inorganic barrier layer (a) does not easily cause cracks and does not easily cause impairment of the gas barrier property.

In general, the alicyclic polyolefin resin often has low affinity to other materials, while the inorganic barrier layer (a) may have high affinity to both the alicyclic polyolefin resin and a heat-melting layer (particularly a styrene-based thermoplastic elastomer, and in particular, those including a styrene-conjugated diene block copolymer hydride). Therefore, when the inorganic barrier layer (a) is provided between the film (a) formed of the alicyclic polyolefin resin and the heat-melting layer, adhesion between the film (a) and the heat-melting layer can be improved.

Preferred examples of an inorganic material that may form the inorganic layer may include a metal; an oxide, a nitride, and a nitride oxide of silicon; an oxide, a nitride, and a nitride oxide of aluminum; DLC (diamond-like carbon); and a mixed material of two or more of them. In particular, a material containing at least silicon, such as an oxide or a nitride oxide of silicon is particularly preferable in terms of transparency. DLC is particularly preferable in terms of affinity to the alicyclic polyolefin resin that is the material for the film (a).

Examples of the oxide of silicon may include $SiO_x$. Herein, x is preferably $1.4<x<2.0$ in order to achieve both the transparency and the water vapor barrier property of the inorganic barrier layer (a). Further, examples of the oxide of silicon may include SiOC.

Examples of the nitride of silicon may include $SiN_y$. Herein, y is preferably $0.5<y<1.5$ in order to achieve both the transparency and the water vapor barrier property of the inorganic barrier layer (a).

Examples of the nitride oxide of silicon may include $SiO_pN_q$. In a case where improved adhesion of the inorganic barrier layer (a) is regarded as important, it is preferable that p and q are $1<p<2.0$ and $0<q<1.0$, respectively, to render the inorganic barrier layer (a) rich in oxygen. In a case where improved water vapor barrier property of the inorganic barrier layer (a) are regarded as important, it is preferable that p and q are $0<p<0.8$ and $0.8<q<1.3$, respectively, to render the inorganic barrier layer (a) rich in nitrogen.

Examples of the oxide, nitride, and nitride oxide of aluminum may include $AlO_x$, $AlN_y$, and $AlO_pN_q$.

In particular, in terms of inorganic barrier properties, $SiO_pN_q$, $AlO_x$, or a mixture thereof may be preferably used as the material.

The thickness of the inorganic barrier layer (a) is preferably 100 nm or more, more preferably 300 nm or more, and particularly preferably 500 nm or more, and is preferably 2,500 nm or less, more preferably 2,000 nm or less, and particularly preferably 1,500 nm or less. When the thickness of the inorganic barrier layer (a) is equal to or more than the lower limit of this range, favorable gas barrier property can be achieved. When the thickness is equal to or less than the upper limit, coloring such as yellow-coloring of the composite gas barrier layered body can be suppressed while sufficient gas barrier property are maintained.

The water vapor permeability of the film (a) having the inorganic barrier layer (a) formed thereon, that is, of the gas barrier layered body (A) is preferably $5 \times 10^{-2}$ g/m²·day or less, and more preferably $2 \times 10^{-2}$ g/m²·day or less. The lower limit of the water vapor permeability is desirably 0 g/m²·day. However, even when the water vapor permeability is 0 g/m²·day or more, the gas barrier layered body may be suitably used as long as the water vapor permeability falls within a range equal to or less than the upper limit.

The inorganic barrier layer (a) may be formed on the surface of the film (a) serving as a substrate by, e.g., a film-forming method such as a vapor deposition method, a sputtering method, an ion plating method, an ion beam assist vapor deposition method, an arc discharge plasma vapor deposition method, a thermal CVD method, and a plasma CVD method. In particular, a chemical vapor deposition method such as a thermal CVD method and a plasma CVD method is preferably used. Through the chemical vapor deposition method, the inorganic barrier layer (a) that is flexible can be formed by adjusting the gas component used in formation of the film. When the flexible inorganic barrier layer (a) is obtained, the inorganic barrier layer (a) can follow the deformation of the film (a) and size change of the film (a) under a high-temperature and high-humidity environment. Therefore, the inorganic barrier layer (a) can be formed under a low-vacuum environment at a high film-forming rate, and favorable gas barrier property can be achieved. When the inorganic barrier layer (a) is formed by such a chemical vapor deposition method, the lower limit of the thickness thereof is preferably 300 nm or more, and more preferably 500 nm or more, and the upper limit thereof is preferably 2,000 nm or less, and more preferably 1,500 nm or less.

In the gas barrier layered body (A), one or more inorganic barrier layers (a) are directly provided on at least one surface of the film (a). The inorganic barrier layers (a) may be provided on respective front and back surfaces of the film (a), and usually, are provided on one of the surfaces. Only one or two or more inorganic barrier layers (a) may be provided on one surface of the film (a). Another thin-film organic layer may be provided between two inorganic barrier layers. In terms of production cost and sure achievement of bendable property, it is preferable that only one inorganic barrier layer (a) is provided. When two or more inorganic barrier layers (a) are provided, the gas barrier performance can be further enhanced. When the two or more inorganic barrier layers (a) are provided in a stacked manner, only one closest to the film (a) among the inorganic barrier layers (a) is directly provided on the film (a). When the two or more inorganic barrier layers (a) are provided in a stacked manner, it is preferable that the total thickness of the inorganic barrier layers (a) falls within the aforementioned preferable range of the thickness.

[3. Film (b)]

The composite gas barrier layered body of the present invention has the film (b) formed of an alicyclic polyolefin resin having a thickness that is equal to or less than the thickness of the film (a).

The film (b) is a film of the alicyclic polyolefin resin. Examples of a material constituting the film (b) may include the same materials as those exemplified as the material constituting the film (a). Therefore, the preferable ranges of physical properties (transparency, thermal expansion coefficient and humidity expansion coefficient in a certain thickness, and glass transition temperature, etc.) of the film (b) are the same as the preferable ranges of physical properties of the film (a). Preferred examples of a method of producing the film (b) may include the same methods as the preferred examples of the method of producing the film (a).

The film (b) is a film having a thickness equal to or less than the thickness of the film (a). When the film (b) is the film having a thickness equal to or less than the thickness of the film (a), the thickness region on the side of the film (a) from the inorganic barrier layer (a) (hereinbelow sometimes referred to as "region A") and the thickness region, including the film (b) and the heat-melting layer, on the side of the film (b) from the inorganic barrier layer (a) (hereinbelow sometimes referred to as "region B") can have nearly equal thickness. As described with reference to an example of FIG. 1, the region A is a region extending from the surface 11D of the film (a) 11 on the side of the inorganic barrier layer (a) 12 to the opposite surface 11U, and is a region indicated by an arrow A in FIG. 1. The region B is a region extending from the surface 30U of the heat-melting layer 30 on the side of the inorganic barrier layer (a) to the surface 21D of the film (b) 21 opposite to the heat-melting layer 30, and is a region indicated by an arrow B in FIG. 1.

As described above, when the film (b) is the film having a thickness equal to or less than the thickness of the film (a), and the thicknesses of the region A and the region B are thus made nearly equal, a load applied to the inorganic barrier layer (a) during bending of the composite gas barrier layered body in various directions can be reduced. As a result, generation of a crack in the inorganic barrier layer can be reduced, and a reduction in the gas barrier performance can be suppressed. Further, a stress that causes curing of the region A and a stress that causes curing of the region B are canceled with each other. Therefore, curling of the composite gas barrier layered body can be stably prevented.

The thickness of the film (b) is preferably 5 μm or more and more preferably 10 μm or more, and is preferably 50 μm or less and more preferably 30 μm or less. The thickness of the film (b) may be measured in the same manner as in the measurement of thickness of the film (a).

The ratio of the thickness of the region A relative to the thickness of the region B is preferably 1:2 to 4:1, and more preferably 2:3 to 2:1. When the ratio of the thickness of the region A relative to the thickness of the region B falls within the aforementioned range, the effect of suppressing a reduction in the gas barrier performance and the effect of curing prevention as described above can be particularly favorably exerted. When the heat-melting layer is a layer of a styrene-based thermoplastic elastomer resin, and particularly a layer of a thermoplastic elastomer resin containing a styrene-conjugated diene block copolymer hydride, and the ratio of the thickness of the region A relative to the thickness of the region B falls within the aforementioned range, the effect of suppressing a reduction in the gas barrier performance and the effect of curing prevention as described above can be further favorably exerted.

The ratio of the thickness of the film (a) relative to the thickness of the film (b) is preferably 1:1 to 5:1, and more preferably 10:9 to 3:1. When the ratio of the thickness of the film (a) relative to the thickness of the film (b) falls within the aforementioned range, the effect of suppressing a reduction in the gas barrier performance and the effect of curing prevention as described above can be particularly favorably exerted. When the heat-melting layer is a layer of a styrene-based thermoplastic elastomer resin, and particularly a layer of a thermoplastic elastomer resin containing a styrene-conjugated diene block copolymer hydride, and the ratio of the thickness of the film (a) relative to the thickness of the film (b) falls within the aforementioned range, the effect of suppressing a reduction in the gas barrier performance and the effect of curing prevention can be further favorably exerted.

As a preferable aspect, the composite gas barrier layered body of the present invention may have a function of a ¼ λ wave plate, in addition to a gas barrier function. In this aspect, a film having a retardation in an in-plane direction that can function as the ¼ λ wave plate may be used as the film (a) and the film (b). Specifically, a film in which the total of retardations in an in-plane direction at 550 nm that is a center of wavelength range of visible light (hereinbelow sometimes simply referred to as "Re") of the film (a) and the film (b) is 115 to 160 nm may be used. In this aspect, the ratio of Re of the film (a) relative to Re of the film (b) is not particularly limited. For facilitating production and facilitating optical design, it is preferable that Re of one of the film (a) and the film (b) is a value that can function as a ¼ λ wave plate and Re of the other is approximately isotropic. Specifically, it is preferable that Re of one of the film (a) and the film (b) is 115 to 160 nm, and Re (at 550 nm) of the other is 0 to 25 nm. The film (a) and the film (b) having such retardations may be produced by, e.g., appropriately adjusting stretching conditions in production of the film.

[4. Heat-Melting Layer]

The composite gas barrier layered body of the present invention has the heat-melting layer that is interposed between the inorganic barrier layer (a) and the film (b) to bond the inorganic barrier layer to the film (b). In the example shown in FIG. 1, in the composite gas barrier layered body 100, the gas barrier layered body (A) 10 and the film (b) 21 are thermally compression-bonded via the heat-melting layer 30 so that the inorganic barrier layer (a) 12 and the film (b) 21 face to each other. The region B including the film (b) 21 and the heat-melting layer 30 and the region A including the film (a) are disposed at respective sides of the inorganic barrier layer (a) 12, and the thicknesses of the regions A and B are made nearly equal.

Therefore, the effect of suppressing a reduction in the gas barrier performance and the effect of curling prevention can be obtained.

The heat-melting layer is a layer heating of which results in increase of its flexibility and high adhesion ability; bonding thereof with another layer is effected by thermal compression-bonding, and the adhesion force is kept even after cooling. The heat-melting layer is usually a layer of a resin having such properties.

When a stress is applied, the heat-melting layer may be usually deformed in accordance with the applied stress. Therefore, e.g., even when a stress is applied to the gas barrier layered body (A) 10 or the film (b) 21 by bending the composite gas barrier layered body 100 or applying heat shock, the heat-melting layer 30 can be deformed to absorb the stress. Consequently, concentration of a large stress to a part of the inorganic barrier layer (a) 12 can be suppressed. Thus, occurrence of a crack in the inorganic barrier layer (a) 12 can be prevented. Therefore, the gas barrier property of the composite gas barrier layered body 100 can be favorably maintained. This is an excellent effect in contrast to a case where bonding is performed, e.g., using a UV curable resin as an adhesive. The UV curable resin after curing has high hardness and cannot be deformed by a stress, and a crack in the inorganic barrier layer (a) easily occurs.

The heat-melting layer does not generally contain a residual solvent, or even if it contains a residual solvent, the amount of the residual solvent is smaller than that of a general adhesive. For this reason, the amount of outgas is small. Therefore, the heat-melting layer is unlikely to generate a gas under a low-pressure environment. Accordingly, the composite gas barrier layered body itself mostly does not act as a generation source of the gas and therefore does not much impair the gas barrier property. This is an excellent effect in contrast to a case where the gas barrier layered body (A) and the film (b) are bonded, e.g., via an adhesive which contains a solvent to increase the amount of the outgas.

The aforementioned advantage is particularly useful when the composite gas barrier layered body is provided in an organic EL element. For example, in the production of the organic EL element, the composite gas barrier layered body may be used as a substrate, and a step of forming a layer of an organic material on the substrate may be performed. In the step of forming a layer of an organic material, the temperature may be largely changed, and the substrate may be placed under a low-pressure environment. In this case, when the gas barrier layered body (A) and the film (b) are thermally compression-bonded to each other via the heat-melting layer, occurrence of a crack and generation of outgas are suppressed. Therefore, high gas barrier property can be maintained.

Examples of the heat-melting layer may include layers of a styrene-based thermoplastic elastomer resin, an olefin-based thermoplastic elastomer resin, a vinyl chloride-based thermoplastic elastomer resin, a polyester-based thermoplastic elastomer resin, a urethane-based thermoplastic elastomer resin, and other resins. A layer of a styrene-based thermoplastic elastomer resin is particularly preferable. The styrene-based thermoplastic elastomer resin is a resin containing a styrene-based thermoplastic elastomer and if necessary, an optional component other than the elastomer. The styrene-based thermoplastic elastomer is a thermoplastic elastomer having an aromatic vinyl compound unit as a structural unit of the molecule. The aromatic vinyl compound unit herein means a structural unit having a structure that is formed by polymerization of an aromatic vinyl compound such as styrene. The thermoplastic elastomer is a polymer having rubber elasticity at room temperature even without vulcanization, and is a polymer capable of being molded with an already existing molding machine at high temperature, like an ordinary thermoplastic resin. The thermoplastic elastomer generally has a rubber component with elasticity (i.e., soft segment) and a molecule-restricting component for preventing plastic deformation (i.e., hard segment) in the molecule. The styrene-based thermoplastic elastomer usually has the aromatic vinyl compound unit as the hard segment.

Preferred examples of the styrene-based thermoplastic elastomer may include an aromatic vinyl compound-conjugated diene block copolymer and a hydride thereof. The aromatic vinyl compound-conjugated diene block copolymer herein represents a block copolymer including a polymer block [A] containing an aromatic vinyl compound unit and a polymer block [B] containing a linear conjugated diene compound unit. The linear conjugated diene compound unit means a structural unit having a structure that is formed by polymerization of a linear conjugated diene compound. The block copolymer and the hydride thereof may be modified with, e.g., alkoxysilane, carboxylic acid, carboxylic acid anhydride, or the like. In particular, an aromatic vinyl compound-conjugated diene block copolymer (hereinbelow sometimes referred to as "styrene-conjugated diene block copolymer" as appropriate) that is obtained by using styrene as an aromatic vinyl compound and a hydride thereof are preferable, and a hydride of a styrene-conjugated diene block copolymer is particularly preferable. Hereinbelow, the aromatic vinyl compound-conjugated diene block copolymer and the hydride thereof will be specifically described.

As described above, the polymer block [A] contains an aromatic vinyl compound unit. Examples of an aromatic vinyl compound corresponding to the aromatic vinyl compound unit may include styrene, α-methylstyrene, 2-methylstyrene, 3-methylstyrene, 4-methylstyrene, 2,4-diisopropylstyrene, 2,4-dimethylstyrene, 4-tert-butylstyrene, 5-tert-butyl-2-methylstyrene, 4-monochlorostyrene, dichlorostyrene, 4-monofluorostyrene, and 4-phenylstyrene. One type of the aromatic vinyl compound may be used alone, and two or more types thereof may also be used in combination at any ratio. Among them, an aromatic vinyl compound having no polar group is preferable in terms of hygroscopicity. Styrene is particularly preferable in terms of industrial availability and shock resistance.

In the polymer block [A], the aromatic vinyl compound unit is usually a main component. Specifically, the content ratio of the aromatic vinyl compound unit in the polymer block [A] is usually 90% by weight or more, preferably 95% by weight or more, and more preferably 99% by weight or more. When the amount of the aromatic vinyl compound unit in the polymer block [A] is large as described above, heat resistance of the composite gas barrier layered body can be enhanced.

The polymer block [A] may contain a component other than the aromatic vinyl compound unit. Examples of the component other than the aromatic vinyl compound unit may include a linear conjugated diene compound unit, and a structural unit having a structure that is formed by polymerization of a vinyl compound other than an aromatic vinyl compound.

Examples of a linear conjugated diene compound corresponding to the linear conjugated diene compound unit may include 1,3-butadiene, isoprene, 2,3-dimethyl-1,3-butadiene, and 1,3-pentadiene. One type of the linear conjugated diene compound may be used alone, and two or more types thereof may also be used in combination at any ratio. Among them, a liner conjugated diene compound having no polar group is preferable in terms of hygroscopicity, and specifically, 1,3-butadiene and isoprene are particularly preferable.

Examples of the vinyl compound other than an aromatic vinyl compound may include a linear vinyl compound; a cyclic vinyl compound; a vinyl compound having a nitrile group, an alkoxycarbonyl group, a hydroxycarbonyl group, or a halogen group; an unsaturated cyclic acid anhydride; and an unsaturated imide compound. Specifically, those having no polar group are preferable in terms of hygroscopicity, and preferred examples thereof may include linear olefins such as ethylene, propylene, 1-butene, 1-pentene, 1-hexene, 1-heptene, 1-octene, 1-nonene, 1-decene, 1-dodecene, 1-eicosene, 4-methyl-1-pentene, and 4,6-dimethyl-1-heptene; and cyclic olefins such as vinylcyclohexane. Among them, liner olefins are more preferable, and ethylene and propylene are particularly preferable. One type of the vinyl compound may be used alone, and two or more types thereof may also be used in combination at any ratio.

The content ratio of the component other than the aromatic vinyl compound unit in the polymer block [A] is usually 10% by weight or less, preferably 5% by weight or less, and more preferably 1% by weight or less.

The number of the polymer block [A] in the aromatic vinyl compound-conjugated diene block copolymer is usually 2 or more, and usually 5 or less, preferably 4 or less, and more preferably 3 or less. A plurality of polymer blocks [A] may be the same or different from each other.

As described above, the polymer block [B] contains a linear conjugated diene compound unit. Examples of the linear conjugated diene compound unit may include the same ones as the examples of those which may be contained in the polymer block [A].

In the polymer block [B], the linear conjugated diene compound unit is usually a main component. Specifically, the content ratio of the linear conjugated diene compound unit in the polymer block [B] is usually 90% by weight or more, preferably 95% by weight or more, and more preferably 99% by weight or more. When the amount of the linear conjugated diene compound unit in the polymer block [B] is large as described above, the shock resistance of the composite gas barrier layered body at low temperature can be improved.

The polymer block [B] may contain a component other than the linear conjugated diene compound unit. Examples of the component other than the linear conjugated diene compound unit may include an aromatic vinyl compound unit, and a structural unit having a structure that is formed by polymerization of a vinyl compound other than an aromatic vinyl compound. Examples of the aromatic vinyl compound unit and the structural unit having a structure that is formed by polymerization of a vinyl compound other than an aromatic vinyl compound may include the same ones as the examples of those which may be contained in the polymer block [A].

The content ratio of the component other than the linear conjugated diene compound unit in the polymer block [B] is usually 10% by weight or less, preferably 5% by weight or less, and more preferably 1% by weight or less.

Particularly, when the content ratio of the aromatic vinyl compound unit in the polymer block [B] is low, flexibility of the heat-melting layer at low temperature can be improved, and shock resistance of the composite gas barrier layered body at low temperature can be improved.

The number of polymer block [B] in the aromatic vinyl compound-conjugated diene block copolymer is usually one or more, but may be two or more. When the number of polymer block [B] in the aromatic vinyl compound-conjugated diene block copolymer is 2 or more, the polymer blocks [B] may be the same or different from each other.

The form of the block of the aromatic vinyl compound-conjugated diene block copolymer may be a linear block or a radial block. Among them, a linear block is preferable since the mechanical strength is excellent. The form of the aromatic vinyl compound-conjugated diene block copolymer is particularly preferably a triblock copolymer in which the polymer blocks [A] are bonded to both terminals of the polymer block [B]; or a pentablock copolymer in which the polymer blocks [B] are bonded to both terminals of the polymer block [A] and other polymer blocks [A] are bonded to the other terminal of each of the polymer blocks [B].

In the aromatic vinyl compound-conjugated diene block copolymer, the weight ratio of the total polymer block [A] relative to the total aromatic vinyl compound-conjugated diene block copolymer is denoted by wA, and the weight ratio of the total polymer block [B] relative to the total aromatic vinyl compound-conjugated diene block copolymer is denoted wB. In this case, the ratio of wA relative to wB (wA/wB) is preferably 20/80 or more, more preferably 35/65 or more, and particularly preferably 40/60 or more, and is preferably 80/20 or less, more preferably 65/35 or less, and particularly preferably 60/40 or less. When wA/wB is equal to or more than the lower limit of the aforementioned range, heat resistance of the composite gas barrier layered body can be improved. When wA/wB is equal to or less than the upper limit, flexibility of the heat-melting layer can be improved, and the gas barrier property of the composite gas barrier layered body 100 can be favorably maintained with stability.

When the number of the polymer block [A] or [B] is plural, the weight average molecular weight of a polymer block of which the weight average molecular weight is the largest in the polymer block [A] is denoted by Mw(A1), the weight average molecular weight of a polymer block of which the weight average molecular weight is the smallest in the polymer block [A] is denoted by Mw(A2), the weight average molecular weight of a polymer block of which the weight average molecular weight is the largest in the polymer block [B] is denoted by Mw(B1), and the weight average molecular weight of a polymer block of which the weight average molecular weight is the smallest in the polymer block [B] is denoted by Mw(B2). In this case, the ratio of Mw(A1) relative to Mw(A2) "Mw(A1)/Mw(A2)" and the ratio of Mw(B1) relative to Mw(B2) "Mw(B1)/Mw(B2)" are each preferably 2.0 or less, more preferably 1.5 or less, and particularly preferably 1.2 or less. Thereby dispersion of various values of physical properties can be reduced.

The molecular weight of the aromatic vinyl compound-conjugated diene block copolymer is usually 30,000 or more, preferably 40,000 or more, and more preferably 50,000 or more, and is usually 200,000 or less, preferably 150,000 or less, and more preferably 100,000 or less, as a weight average molecular weight (Mw) in terms of polystyrene that is measured by GPC using tetrahydrofuran (THF) as a solvent. The molecular weight distribution (Mw/Mn) of the aromatic vinyl compound-conjugated diene block copolymer is preferably 3 or less, more preferably 2 or less, and particularly preferably 1.5 or less.

When a block copolymer having three polymer blocks is produced, examples of a method for producing an aromatic vinyl compound-conjugated diene block copolymer may include a method including a first step of polymerizing a monomer mixture (a1) containing an aromatic vinyl compound as a monomer component that forms the polymer block [A], a second step of polymerizing a monomer mixture (b1) containing a linear conjugated diene compound as a monomer component that forms the polymer block [B], and a third step of polymerizing a monomer mixture (a2) containing an aromatic vinyl compound as the monomer component that forms the polymer block [A] (the monomer mixtures (a1) and (a2) may be the same or different); and a method including a first step of polymerizing a monomer mixture (a1) containing an aromatic vinyl compound as a monomer component that forms the polymer block [A], a second step of polymerizing a monomer mixture (b1) containing a linear conjugated diene compound as a monomer component that forms the polymer block [B], and a step of coupling terminals of the polymer blocks [B] using a coupling agent.

As the method of polymerizing each of the aforementioned monomer mixtures to obtain each polymer block, e.g., radical polymerization, anionic polymerization, cationic polymerization, coordination anionic polymerization, or coordination cationic polymerization may be used. In order to facilitate a polymerization operation and a hydrogenation reaction in a subsequent step, radical polymerization, anionic polymerization, and cationic polymerization that are performed by living polymerization are preferable, and living anionic polymerization is particularly preferable.

The polymerization of the monomer mixtures is performed in the presence of a polymerization initiator at a temperature range of usually 0° C. or higher, preferably 10° C. or higher, and more preferably 20° C. or higher, and usually 100° C. or lower, preferably 80° C. or lower, and particularly preferably 70° C. or lower.

In living anionic polymerization, e.g., monoorganic lithium such as n-butyllithium, sec-butyllithium, tert-butyllithium, and hexyllithium; a multifunctional organic lithium compound such as dilithiomethane, 1,4-dilithiobutane, and 1,4-dilithio-2-ethylcyclohexane; may be used as the polymerization initiator. One type of the polymerization initiator may be used alone, and two or more types thereof may also be used in combination at any ratio.

The mode of polymerization reaction may be any of solution polymerization and slurry polymerization. In particular, when solution polymerization is performed, reaction heat is easily removed.

In solution polymerization, an inert solvent capable of dissolving a polymer that is obtained in each step is used as a solvent. Examples of the inert solvent may include aliphatic hydrocarbons such as n-pentane, isopentane, n-hexane, n-heptane, and isooctane; alicyclic hydrocarbons such as cyclopentane, cyclohexane, methylcyclopentane, methylcyclohexane, and decalin; and aromatic hydrocarbons such as benzene and toluene. One type of the solvent may be used alone, and two or more types thereof may also be used in combination at any ratio. Among them, it is preferable to use an alicyclic hydrocarbon as the solvent since it can be used in a hydrogenation reaction as it is as the inert solvent and the solubility of the aromatic vinyl compound-conjugated diene block copolymer in the solvent is favorable. The amount of the solvent to be used is usually 200 parts by weight to 2,000 parts by weight with respect to 100 parts by weight of all monomers used.

When each of the monomer mixtures contains two or more types of monomers, e.g., a randomizer may be used to prevent elongation of a chain of only one component. In particular, when a polymerization reaction is performed by anionic polymerization, a Lewis base compound or the like is preferably used as the randomizer. Examples of the Lewis base compound may include ether compounds such as dimethyl ether, diethyl ether, diisopropyl ether, dibutyl ether, tetrahydrofuran, diphenyl ether, ethylene glycol diethyl ether, and ethylene glycol methyl phenyl ether; tertiary amine compounds such as tetramethylethylene diamine, trimethylamine, trimethylamine, and pyridine; alkali metal alkoxide compounds such as potassium-tert-amyloxide and potassium-tert-butyloxide; and phosphine compounds such as triphenyl phosphine. One type thereof may be used alone, and two or more types thereof may also be used in combination at any ratio.

It is preferable that the aromatic vinyl compound-conjugated diene block copolymer is hydrogenated for use. When a hydride of the aromatic vinyl compound-conjugated diene block copolymer is used as the resin constituting the heat-melting layer, amount of outgas to be generated from the heat-melting layer can be further reduced.

The hydride of the aromatic vinyl compound-conjugated diene block copolymer is a substance obtained by hydrogenation of a carbon-carbon unsaturated bond in a main chain and a side chain and a carbon-carbon unsaturated bond in an aromatic ring of the aromatic vinyl compound-conjugated diene block copolymer. The hydrogenation ratio is usually 90% or more, preferably 97% or more, and more preferably 99% or more. When the hydrogenation ratio is higher, heat resistance and light resistance of the heat-melting layer can be better improved. Herein, the hydrogenation ratio of the hydride may be determined by measurement through $^1$H-NMR.

The hydrogenation ratio of the carbon-carbon unsaturated bond in the main chain and the side chain is preferably 95% or more, and more preferably 99% or more. When the hydrogenation ratio of the carbon-carbon unsaturated bond in the main chain and the side chain is increased, light resistance and oxidation resistance of the heat-melting layer can be further enhanced.

The hydrogenation ratio of the carbon-carbon unsaturated bond in the aromatic ring is preferably 90% or more, more preferably 93% or more, and particularly preferably 95% or more. When the hydrogenation ratio of the carbon-carbon unsaturated bond in the aromatic ring is increased, the glass transition temperature of the polymer block obtained by hydrogenation of the polymer block [A] increases. Therefore, heat resistance of the composite gas barrier layered body can effectively be enhanced.

The hydrogenation method is not specifically limited as long as a desired hydride can be obtained. A hydrogenation method capable of increasing the hydrogenation ratio and reducing a chain scission reaction of the block copolymer is preferable. Examples of such a preferable hydrogenation method may include a method using a hydrogenation catalyst containing at least one metal selected from the group consisting of nickel, cobalt, iron, titanium, rhodium, palladium, platinum, ruthenium, and rhenium. As the hydrogenation catalyst, any of a heterogeneous catalyst and a homogeneous catalyst may be used. It is preferable that the hydrogenation reaction is performed in an organic solvent.

As the heterogeneous catalyst, a metal or a metal compound as it is may be used, and the catalyst supported on a suitable carrier may also be used. Examples of the carrier may include activated carbon, silica, alumina, calcium carbonate, titania, magnesia, zirconia, diatomaceous earth, silicon carbide, and calcium fluoride. The amount of the supported catalyst is usually 0.1% by weight or more, and preferably 1% by weight or more, and is usually 60% by weight or less, and preferably 50% by weight or less with respect to the total amount of the catalyst and the carrier. The specific surface area of a supported type catalyst is preferably 100 m²/g to 500 m²/g. The average micropore diameter of the supported type catalyst is preferably 100 Å or more, and more preferably 200 Å or more, and is preferably 1,000 Å or less, and more preferably 500 Å or less. The specific surface area herein is determined by measuring the nitrogen adsorption amount and using a BET method. The average micropore diameter may be measured through a mercury penetration method.

As the homogeneous catalyst, e.g., a catalyst including a compound of nickel, cobalt, titanium, or iron in combination with an organometallic compound; an organometallic complex catalyst of rhodium, palladium, platinum, ruthenium, or rhenium; or the like may be used.

Examples of the compound of nickel, cobalt, titanium, or iron may include acetylacetonate compounds, salts of carboxylic acid, and cyclopentadienyl compounds of each of the metals.

Examples of the organometallic compound may include organoaluminum compounds including alkyl aluminum such as triethyl aluminum and triisobutyl aluminum, halogenated aluminum such as diethyl aluminum chloride and ethyl aluminum dichloride, and hydrogenated alkyl aluminum such as diisobutyl aluminum hydride; and organolithium compounds.

Examples of the organometallic complex catalyst may include transition metal complexes such as dihydride-tetrakis(triphenylphosphine) ruthenium, dihydride-tetrakis(triphenylphosphine) iron, bis(cyclooctadiene) nickel, and bis(cyclopentadienyl) nickel.

One type of the hydrogenation catalyst may be used alone, and two or more types thereof may also be used in combination at any ratio.

The amount of the hydrogenation catalyst to be used is usually 0.01 parts by weight or more, preferably 0.05 parts by weight or more, and more preferably 0.1 parts by weight or more, and is usually 100 parts by weight or less, preferably 50 parts by weight or less, and more preferably 30 parts by weight or less, with respect to 100 parts by weight of the aromatic vinyl compound-conjugated diene block copolymer.

When the temperature of the hydrogenation reaction is usually 10° C. or higher, preferably 50° C. or higher, and more preferably 80° C. or higher, and usually 250° C. or lower, preferably 200° C. or lower, and more preferably 180° C. or lower, the hydrogenation ratio increases, and molecule scission is reduced. When the hydrogen pressure during the hydrogenation reaction is usually 0.1 MPa or more, preferably 1 MPa or more, and more preferably 2 MPa or more, and is usually 30 MPa or less, preferably 20 MPa or less, and more preferably 10 MPa or less, the hydrogenation ratio increases, molecular chain scission is reduced, and the operability is excellent.

The hydrogenation catalyst and a polymerization catalyst are removed from a reaction solution containing a hydride, e.g., by a method such as filtration and centrifugation, and the hydride of the aromatic vinyl compound-conjugated diene block copolymer obtained by the aforementioned method is then collected from the reaction solution. Examples of the method for collecting the hydride from the reaction solution may include a steam solidification method of removing a solvent by steam stripping from a solution in which a hydride is dissolved; a direct desolvating method of removing a solvent by heating under reduced pressure; and a solidification method in which a solution is added to a poor solvent of a hydride, resulting in precipitation and solidification.

Although the form of the hydride of the aromatic vinyl compound-conjugated diene block copolymer collected is not limited, a shape of pellets is usually adopted since it is easily subjected to later molding processing or modification reaction. When the hydride is collected from the reaction solution by the direct desolvating method, e.g., the hydride in a molten state may be extruded from dies into a strand shape, cooled, and cut with a pelletizer into a pellet shape, before being molded into various shapes. When the solidification method is used, e.g., the obtained coagulation may be dried, extruded in a molten state with an extruder, and cut into a pellet shape in the same manner as described above, before being molded into various shapes or subjected to a modification reaction.

The molecular weight of the hydride of the aromatic vinyl compound-conjugated diene block copolymer is usually 30,000 or more, preferably 40,000 or more, and more preferably 45,000 or more, and is usually 200,000 or less, preferably 150,000 or less, and more preferably 100,000 or less, as the weight average molecular weight (Mw) in terms of polystyrene that is measured by gel permeation chromatography (GPC) using tetrahydrofuran as a solvent. The molecular weight distribution (Mw/Mn) of the hydride of the aromatic vinyl compound-conjugated diene block copolymer is preferably 3 or less, more preferably 2 or less, and particularly preferably 1.5 or less. When the molecular weight and molecular weight distribution of the hydride fall within the aforementioned ranges, mechanical strength and heat resistance of the composite gas barrier layered body can be improved.

The hydride of the aromatic vinyl compound-conjugated diene block copolymer may be one having an alkoxysilyl group. The hydride of the aromatic vinyl compound-conjugated diene block copolymer having an alkoxysilyl group may be produced by a hydrogenation reaction of the block copolymer, and if necessary, modification of the reaction product with alkoxysilane, to introduce an alkoxysilyl group into the reaction product.

The alkoxysilyl group may be bonded to the hydride of the aromatic vinyl compound-conjugated diene block copolymer directly or via a divalent organic group such as an alkylene group. As the method for introducing an alkoxysilyl group, a method in which the hydride of the aromatic vinyl compound-conjugated diene block copolymer is reacted with an ethylenically unsaturated silane compound in the presence of a peroxide may be used. When the amount of the alkoxysilyl group to be introduced is too large, the degree of cross-linking between alkoxysilyl groups decomposed by a trace amount of water or the like increases, resulting in a problem in which the adhesion to a sealing subject is likely to decrease. Therefore, when the hydride of the aromatic vinyl compound-conjugated diene block copolymer having an alkoxysilyl group is used as the hydride of the aromatic vinyl compound-conjugated diene block copolymer, the amount of the alkoxysilyl group to be introduced is usually 0.1 to 10 g/100 g, preferably 0.2 to 5 g/100 g, and more preferably 0.3 to 3 g/100 g, with respect to the weight of the hydride of the aromatic vinyl compound-conjugated diene block copolymer before the introduction of the alkoxysilyl group. The amount of the alkoxysilyl group to be introduced is calculated from $^1$H-NMR spectrum (when the amount is small, the number of integration times is increased).

The ethylenically unsaturated silane compound is not particularly limited, and any ethylenically unsaturated silane compound that is capable of being subjected to graft polymerization with the aforementioned hydride of the aromatic vinyl compound-conjugated diene block copolymer to achieve introduction of an alkoxysilyl group into the hydride of the aromatic vinyl compound-conjugated diene block copolymer may be appropriately selected. Examples of the ethylenically unsaturated silane compound may include at least one selected from ethylenically unsaturated silane compounds such as vinyltrimethoxysilane, vinyltriethoxysilane, allyltrimethoxysilane, allyltriethoxysilane, dimethoxymethylvinylsilane, diethoxymethylvinylsilane, p-styryltrimethoxysilane, p-styryltriethoxysilane, 3-methacryloxypropyltrimethoxysilane, 3-methacryloxypropylmethyldimethoxysilane, 3-methacryloxypropyltriethoxysilane, 3-methacryloxypropylmethyldiethoxysilane, 3-acryloxypropyltrimethoxysilane, 3-acryloxypropyltriethoxysilane, and 2-norbornen-5-yltrimethoxysilane. In the present invention, among them, vinyltrimethoxysilane, vinyltriethoxysilane, allyltrimethoxysilane, allyltriethoxysilane, dimethoxymethylvinylsilane, diethoxymethylvinylsilane, and p-styryltrimethoxysilane are suitably used.

One type of the ethylenically unsaturated silane compound may be used alone, and two or more types thereof may also be used in combination. The amount of the ethylenically unsaturated silane compound to be used is usually 0.1 to 10 parts by weight, preferably 0.2 to 5 parts by weight, and more preferably 0.3 to 3 parts by weight, with respect to 100 parts by weight of the hydride of the aromatic vinyl compound-conjugated diene block copolymer.

As the peroxide, one or more selected from organic peroxides such as dibenzoyl peroxide, tert-butyl peroxyacetate, 2,2-di(tert-butylperoxy)butane, tert-butyl peroxybenzoate, tert-butyl cumyl peroxide, dicumyl peroxide, di-tert-hexyl peroxide, 2,5-dimethyl-2,5-di(tert-butylperoxyhexane), di-tert-butyl peroxide, 2,5-dimethyl-2,5-di(tert-butylperoxy)hexane-3, tert-butyl hydroperoxide, tert-butyl peroxyisobutyrate, lauroyl peroxide, dipropionyl peroxide, and p-menthane hydroperoxide may be used. In the present invention, among them, the peroxide having a 1-minute half-life temperature of 170 to 190° C. is preferably used. For example, tert-butyl cumyl peroxide, dicumyl peroxide, di-tert-hexyl peroxide, 2,5-dimethyl-2,5-di(tert-butylperoxyhexane), and di-tert-butyl peroxide are suitably used.

One type of the peroxide may be used alone, and two or more types thereof may also be used in combination. The amount of the peroxide to be used is usually 0.01 to 5 parts by weight, preferably 0.2 to 3 parts by weight, and more preferably 0.3 to 2 parts by weight, with respect to 100 parts by weight of the hydride of the aromatic vinyl compound-conjugated diene block copolymer.

The method of reacting the hydride of the aromatic vinyl compound-conjugated diene block copolymer with the ethylenically unsaturated silane compound in the presence of the peroxide may be performed using a heating kneader or a reaction vessel. For example, when a mixture of the hydride of the aromatic vinyl compound-conjugated diene block copolymer, the ethylenically unsaturated silane compound, and the peroxide is molten with heat using a biaxial kneader at a temperature that is equal to or higher than the melting temperature of the block copolymer and kneaded for a desired time, modification can be achieved. For the block copolymer of the present invention, the temperature is usually 180 to 240° C., preferably 190 to 230° C., and more preferably 200 to 220° C. The time for kneading with heat is usually 0.1 to 15 minutes, preferably 0.2 to 10 minutes, and more preferably about 0.3 to about 5 minutes. When a continuous kneading system including a biaxial kneader, a single axis extruder, and the like is used, the mixture may be continuously kneaded and extruded so that the retention time falls within the aforementioned range.

Since the amount of the alkoxysilyl group to be introduced is small, the molecular weight of the hydride of the aromatic vinyl compound-conjugated diene block copolymer having an alkoxysilyl group is not largely changed as compared with the molecular weight of hydride of the aromatic vinyl compound-conjugated diene block copolymer before the introduction of the alkoxysilyl group. However, the molecular weight distribution is increased since a cross-linking reaction and a scission reaction of the polymer occur due to the modification reaction in the presence of the peroxide. The molecular weight of the hydride of the aromatic vinyl compound-conjugated diene block copolymer having an alkoxysilyl group is usually (30,000 to 200,000), preferably (40,000 to 150,000), and more preferably (50,000 to 120,000), as the weight average molecular weight (Mw) in terms of polystyrene that is measured by gel permeation chromatography (GPC) using tetrahydrofuran as a solvent. The molecular weight distribution (Mw/Mn) is usually 3.5 or less, preferably 2.5 or less, and particularly preferably 2.0 or less. When Mw and Mw/Mn fall within these ranges, mechanical strength and tensile elongation of the composite gas barrier layered body of the present invention are favorably maintained. In this application, the molecular weight may be measured, e.g., under the following GPC measurement condition. As a column for measurement of the weight average molecular weight by GPC, TSKgroundColumn Super H-H, TSKgel Super H50000, TSKgel Super H4000, or TSKgel Super H2000 (all the columns are available from TOSOH CORPORATION) is used, and the temperature of a constant-temperature column vessel during measurement may be 40° C. The adhesion of the modified polymer obtained as described above to another layer may be improved, and strength of the composite gas barrier layered body of the present invention may be improved.

Examples of the optional component that may be contained in the styrene-based thermoplastic elastomer resin may include a light stabilizer, an ultraviolet absorber, an antioxidant, a lubricant, and an inorganic filler, which are used to improve the weather resistance, the heat resistance, and the like. One type of the optional component may be used alone, and two or more types thereof may also be used in combination at any ratio.

It is preferable that the light stabilizer is a hindered amine-based light stabilizer, and particularly preferably a compound having a 3,5-di-tert-butyl-4-hydroxyphenyl group, a 2,2,6,6-tetramethylpiperidyl group, or a 1,2,2,6,6-pentamethyl-4-piperidyl group in the structure.

Specific examples of the light stabilizer may include mixed ester compounds of 1,2,3,4-butanetetracarboxylic acid, 1,2,2,6,6-pentamethyl-4-piperidinol, and 3,9-bis(2-hydroxy-1,1-dimethylethyl)-2,4,8,10-tetraoxaspiro[5,5]undecane, a polycondensate of 1,6-hexanediamine-N,N'-bis(2,2,6,6-tetramethyl-4-piperidyl) and morpholine-2,4,6-trichloro-1,3,5-triazine, 1-[2-[3-(3,5-di-tert-butyl-4-hydroxyphenyl)propionyloxy]ethyl]-4-[3-3,5-di-tert-butyl-4-hydroxyphenyl)propionyloxy]-2,2,6,6-tetramethylpiperidine, 2-(3,5-di-tert-butyl-4-hydroxybenzyl)-2-n-butylmalonic acid-bis(1,2,2,6,6-pentamethyl-4-piperidyl), 2-(3,5-di-tert-butyl-4-hydroxybenzyl)-2-n-butylmalonic acid-bis(1,2,2,6,6-pentamethyl-4-piperidyl), 4-(3-(3,5-di-tert-butyl-4-hydroxyphenyl)propionyloxy)-1-(2-(3-(3,5-di-tert-butyl-4-hydroxyphenyl)propionyloxy)ethyl)-2,2,6,6-tetramethylpiperidine, 4-(N-(1-benzyl-2-phenylethyl)-N-formylamino)-2,2,6,6-tetramethylpiperidine, 4-(N-(2-(1- pyrrolidyl)ethyl)-N-formylamino)-2,2,6,6-tetramethylpiperidine, 4-(N-(2-(4-morpholinyl)ethyl)-N-formylamino)-2,2,6,6-tetramethyl-N-methylpiperidine, 4-(N-(2-(4-morpholinyl)ethyl)-N-formylamino)-2,2,6,6-tetramethylpiperidine, 4-(N-(2-(diisopropylamino)ethyl)-N-formylamino)-2,2,6,6-tetramethylpiperidine, 4-(N-(2,4,6-trimethylbenzyl)-N-formylamino)-2,2,6,6-tetramethylpiperidine, 4-(N-(3-(2-ethylhexoxy)propyl)-N-formylamino)-2,2,6,6-tetramethylpiperidine, 4-(N-(3,4-(methylenedioxy)benzyl)-N-formylamino)-2,2,6,6-tetramethylpiperidine, 4-(N-(bicyclo[2.2.1]heptyl)-N-formylamino)-2,2,6,6-tetramethylpiperidine, 4-(N-1,2,2-trimethylpropyl-N-formylamino)-2,2,6,6-tetramethylpiperidine, 4-(N-1,3-dimethylbutyl-N-formylamino)-2,2,6,6-tetramethylpiperidine, 4-(N-1-benzylethyl-N-formylamino)-2,2,6,6-tetramethylpiperidine, benzylethyl-N-formylamino)-2,2,6,6-tetramethylpiperidine, 4-(N-2,2-dimethylpropyl-N-formylamino)-2,2,6,6-tetramethylpiperidine, 4-(N-2-ethylhexyl-N-formylamino)-2,2,6,6-tetramethylpiperidine, 4-(N-3-methylbutyl-N-formylamino)-2,2,6,6-tetramethylpiperidine, 4-(N-4-hydroxybutyl-N-formylamino)-2,2,6,6-tetramethylpiperidine, 4-(N-4-hydroxybutyl-N-formylamino)-2,2,6,6-tetramethylpiperidine, 4-(N-i-propyl-N-formylamino)-2,2,6,6-tetramethylpiperidine, 4-(N-i-propyl-N-formylamino)-2,2,6,6-tetramethylpiperidine, 4-(N-tert-butyl-N-formylamino)-2,2,6,6-tetramethylpiperidine, 4-(N-isopropylbenzyl-N-formylamino)-2,2,6,6-tetramethylpiperidine, 4-(N-ethoxyethyl-N-formylamino)-2,2,6,6-tetramethylpiperidine, 4-(N-ethoxypropyl-N-formylamino)-2,2,6,6-tetramethylpiperidine, 4-(N-octadecyl-N-formylamino)-2,2,6,6-tetramethylpiperidine, 4-(N-octyl-N-formylamino)-2,2,6,6-tetramethyl-N-methylpiperidine, 4-(N-octyl-N-formylamino)-2,2,6,6-tetramethylpiperidine, 4-(N-chlorobenzyl-N-formylamino)-2,2,6,6-tetramethylpiperidine, 4-(N-diethylaminoethyl-N-formylamino)-2,2,6,6-tetramethylpiperidine, 4-(N-cyclododecyl-N-formylamino)-2,2,6,6-tetramethylpiperidine, 4-(N-cyclohexyl-N-formylamino)-2,2,6,6-tetramethyl-N-methylcarbonylpiperidine, 4-(N-cyclohexyl-N-formylamino)-2,2,6,6-tetramethyl-N-methylpiridine, 4-(N-cyclohexyl-N-formylamino)-2,2,6,6-tetramethylpiridine, 4-(N-cyclopentyl-N-formylamino)-2,2,6,6-tetramethyl-N-methylpiperidine, 4-(N-cyclopentyl-N-formylamino)-2,2,6,6-tetramethylpiperidine, 4-(N-dimethylaminopropyl-N-formylamino)-2,2,6,6-tetramethylpiperidine, 4-(N-decyl-N-formylamino)-2,2,6,6-tetramethyl-N-methylpiperidine, 4-(N-decyl-N-formylamino)-2,2,6,6-tetramethylpiperidine, 4-(N-dodecyl-N-formylamino)-2,2,6,6-tetramethylpiperidine, 4-(N-pyridinylmethyl-N-formylamino)-2,2,6,6-tetramethylpiperidine, 4-(N-phenylethyl-N-formylamino)-2,2,6,6-tetramethyl-N-methylpiridine, 4-(N-phenylethyl-N-formylamino)-2,2,6,6-tetramethylpiridine, 4-(N-butyl-N-formylamino)-2,2,6,6-tetramethyl-N-methylpiperidine, 4-(N-butyl-N-formylamino)-2,2,6,6-tetramethyl-N-methylpiperidine, 4-(N-fluorobenzyl-N-formylamino)-2,2,6,6-tetramethylpiperidine, 4-(N-hexyl-N-formylamino)-2,2,6,6-tetramethyl-N-methylpiperidine, 4-(N-hexyl-N-formylamino)-2,2,6,6-tetramethylpiperidine, 4-(N-pentyl-N-formylamino)-2,2,6,6-tetramethyl-N-methylpiperidine, 4-(N-pentyl-N-formylamino)-2,2,6,6-tetramethylpiperidine, 4-(N-methylcyclohexyl-N-formylamino)-2,2,6,6-tetramethylpiridine, 4-(N-methylbenzyl-N-formylamino)-2,2,6,6-tetramethylpiperidine, 4-(N-methoxylbenzyl-N-formylamino)-2,2,6,6-tetramethylpiperidine, 4-(formylamino)-2,2,6,6-tetramethyl-N-methylpiperidine, 4-(formylamino)-2,2,6,6-tetramethylpiperidine, 4-[N-(2,2,6,6-tetramethyl-4-piperidyl)-N-formylamino]-2,2,6,6-tetramethyl-N-methylpiridine, 4-[N-(2,2,6,6-tetramethyl-4-piperidyl)-N-formylamino]-2,2,6,6-tetramethylpiridine, N,N',N'',N'''-tetrakis-(4,6-bis(butyl-(N-methyl-2,2,6,6-tetramethylpiperidin-4-yl)amino)-triazin-2-yl)-4,7-diazadecane-1,10-amine, N,N'-bis(2,2,6,6-tetramethyl-4-N-methylpiperidyl)-N,N'-diformyl-1,4-xylylenediamine, N,N'-bis(2,2,6,6-tetramethyl-4-N-methylpiperidyl)-N,N'-diformyl-trimethylenediamine, N,N'-bis(2,2,6,6-tetramethyl-4-N-methylpiperidyl)-N,N'-diformyl-hexamethylenediamine, N,N'-bis(2,2,6,6-tetramethyl-4-N-methylpiperidyl)-N,N'-diformyl-ethylenediamine, N,N'-bis(2,2,6,6-tetramethyl-4-N-piperidyl)-N,N'-diformyl-1,4-xylylenediamine, N,N'-bis(2,2,6,6-tetramethyl-4-piperidyl)N,N'-diformyl-ethylendiamine, N,N'-bis(2,2,6,6-tetramethyl-4-piperidyl)-N,N'-diformyl-trimethylenediamine, N,N'-bis(2,2,6,6-tetramethyl-4-piperidyl)-N,N'-diformyl-hexamethylenediamine, N,N'-bis(2,2,6,6-tetramethyl-4-piperidyl)-N,N'-bishexamethyleneacrylic acid amide, N,N'-bis(2,2,6,6-tetramethyl-4-piperidyl)-N,N'-bishexamethylenearachic acid amide, N,N'-bis(2,2,6,6-tetramethyl-4-piperidyl)-N,N'-bishexamethyleneangelic acid amide, N,N'-bis(2,2,6,6-tetramethyl-4-piperidyl)-N,N'-bishexamethyleneundecylic acid amide, N,N'-bis(2,2,6,6-tetramethyl-4-piperidyl)-N,N'-bishexamethyleneundecylenic acid amide, N,N'-bis(2,2,6,6-tetramethyl-4-piperidyl)-N,N'-bishexamethyleneoleic acid amide, N,N'-bis(2,2,6,6-tetramethyl-4-piperidyl)-N,N'-bishexamethylenegadoleic acid amide, N,N'-bis(2,2,6,6-tetramethyl-4-piperidyl)-N,N'-bishexamethylenecaprylic acid amide, N,N'-bis(2,2,6,6-tetramethyl-4-piperidyl)-N,N'-bishexamethylenecapric acid amide, N,N'-bis(2,2,6,6-tetramethyl-4-piperidyl)-N,N'-bishexamethylenecaproic acid amide, N,N'-bis(2,2,6,6-tetramethyl-4-piperidyl)-N,N'-bishexamethylenecrotonic acid amide, N,N'-bis(2,2,6,6-tetramethyl-4-piperidyl)-N,N'-bishexamethylenecitronellic acid amide, N,N'-bis(2,2,6,6-tetramethyl-4-piperidyl)-N,N'-bishexamethylenestearic acid amide, N,N'-bis(2,2,6,6-tetramethyl-4-piperidyl)-N,N'-bishexamethylenezoomaric acid amide, N,N'-bis(2,2,6,6-tetramethyl-4-piperidyl)-N,N'-bishexamethylenetridecylic acid amide, N,N'-bis(2,2,6,6-tetramethyl-4-piperidyl)-N,N'-bishexamethylenenonadecylic acid amide, N,N'-bis(2,2,6,6-tetramethyl-4-piperidyl)-N,N'-bishexamethylenepalmitic acid amide, N,N'-bis(2,2,6,6-tetramethyl-4-piperidyl)-N,N'-bishexamethylenebrenzterebic acid amide, N,N'-bis(2,2,6,6-tetramethyl-4-piperidyl)-N,N'-bishexamethylenepropionic acid amide, N,N'-bis(2,2,6,6-tetramethyl-4-piperidyl)-N,N'-bishexamethyleneheptanoic acid amide, N,N'-bis(2,2,6,6-tetramethyl-4-piperidyl)-N,N'-bishexamethylenebehenic acid amide, N,N'-bis(2,2,6,6-tetramethyl-4-piperidyl)-N,N'-bishexamethylenepelargonic acid amide, N,N'-bis(2,2,6,6-tetramethyl-4-piperidyl)-N,N'-bishexamethylenepentadecylic acid amide, N,N'-bis(2,2,6,6-tetramethyl-4-piperidyl)-N,N'-bishexamethylenemargaric acid amide, N,N'-bis(2,2,6,6-tetramethyl-4-piperidyl)-N,N'-bishexamethylenemyristic acid amide, N,N'-bis(2,2,6,6-tetramethyl-4-piperidyl)-N,N'-bishexamethylenelauric acid amide, N,N'-bis(2,2,6,6-tetramethyl-4-piperidyl)-N,N'-bishexamethylenelinderic acid amide, N,N'-bis(2,2,6,6-tetramethyl-4-piperidyl)-N,N'-bishexamethylenevaleric acid amide, N,N'-bis(2,2,6,6-tetramethyl-4-piperidyl)-N,N'-bishexamethyleneacetic acid amide, N,N'-bis(2,2,6,6-tetramethyl-4-piperidyl)-N,N'-bishexamethylenetetradecenoic acid amide, N,N'-bis(2,2,6,6-tetramethyl-4-piperidyl)-N,N'-bishexamethylenebutyric acid amide, a polymer of dimethyl succinate and 4-hydroxy-2,2,6,6-tetramethyl-1-piperidine ethanol, a polycondensate of dibutylamine, 1,3,5-triazine, and N,N'-bis(2,2,6,6-tetramethyl-4-piperidyl)butylamine, bis(1,2,2,6,6-pentamethyl-4-piperidyl)-2-(3,5-di-tert-butyl-4-hydroxybenzyl)-2-n-butyl malonate, bis(2,2,6,6-tetramethyl-4-piperidyl) sebacate, poly[[6-morpholino-s-triazin-2,4-diyl][(2,2,6,6-tetramethyl-4-piperidyl)imino]-hexamethylene[(2,2,6,6-tetramethyl-4-piperidyl)imino], poly[{1,1,3,3-tetramethylbutyl)amino-1,3,5-triazin-2,4-diyl}{(2,2,6,6-tetramethyl-4-piperidyl)imino}hexamethylene{(2,2,6,6-tetramethyl-4-piperidyl)imino}], poly[{6-(1,1,3,3-tetramethylbutyl)amino-1,3,5-triazin-2,4-diyl}{(2,2,6,6-tetramethyl-4-piperidyl)imino}hexamethylene{(2,2,6,6-tetramethyl-4-piperidyl)imino}], and a reaction product of a polymer of N,N'-bis(2,2,6,6-tetramethyl-4-piperidinyl)-1,6-hexanediamine and 2,4,6-trichloro-1,3,5-triazine with N-butyl-1-butaneamine and N-butyl-2,2,6,6-tetramethyl-4-piperidineamine.

Among them, in terms of excellent weather resistance, N,N'-bis(2,2,6,6-tetramethyl-4-N-methylpiperidyl)-N,N'-diformyl-alkylenediamines, N,N'-bis(2,2,6,6-tetramethyl-4-piperidyl)-N,N'-diformyl-alkylenediamines, N,N'-bis(2,2,6,6-tetramethyl-4-piperidyl)-N,N'-bisalkylene fatty acid amides, and poly[{6-(1,1,3,3-tetramethylbutyl)amino-1,3,5-triazin-2,4-diyl}{(2,2,6,6-tetramethyl-4-piperidyl)imino}hexamethylene{(2,2,6,6-tetramethyl-4-piperidyl)imino}] are preferable. N,N'-bis(2,2,6,6-tetramethyl-4-piperidyl)-N,N'-diformyl-alkylenediamines, and a reaction product of a polymer of N,N'-bis(2,2,6,6-tetramethyl-4-piperidinyl)-1,6-hexanediamine and 2,4,6-trichloro-1,3,5-triazine with N-butyl-1-butaneamine and N-butyl-2,2,6,6-tetramethyl-4-piperidineamine are particularly preferable.

The amount of the light stabilizer is usually 0.01 parts by weight or more, preferably 0.02 parts by weight or more, and more preferably 0.03 parts by weight or more, and is usually 5 parts by weight or less, preferably 2 parts by weight or less, and more preferably 1 part by weight or less, with respect to 100 parts by weight of the styrene-based thermoplastic elastomer. When the amount of the light stabilizer is equal to or more than the lower limit of the range, the weather resistance can be enhanced. When the amount is equal to or less than the upper limit, pollution of a T-die and a cooling roller in an extruder can be prevented during a melt molding process in which the styrene-based thermoplastic elastomer resin is molded into a film shape, and the processability can be enhanced.

Examples of the ultraviolet absorber may include a benzophenone-based ultraviolet absorber, a salicylic acid-based ultraviolet absorber, and a benzotriazole-based ultraviolet absorber.

Examples of the benzophenone-based ultraviolet absorber may include 2,4-dihydroxybenzophenone, 2-hydroxy-4-methoxybenzophenone, 2-hydroxy-4-methoxybenzophenone-5-sulfonic acid trihydrate, 2-hydroxy-4-octyloxybenzophenone, 4-dodecaloxy-2-hydroxybenzophenone, 4-benzyloxy-2-hydroxybenzophenone, 2,2',4,4'-tetrahydroxybenzophenone, and 2,2'-dihydroxy-4,4'-dimethoxybenzophenone.

Examples of the salicylic acid-based ultraviolet absorber may include phenyl salicylate, 4-tert-butylphenyl-2-hydroxybenzoate, phenyl-2-hydroxybenzoate, 2,4-di-tert-butylphenyl-3,5-di-tert-butyl-4-hydroxybenzoate, and hexadecyl-3,5-di-tert-butyl-4-hydroxybenzoate.

Examples of the benzotriazole-based ultraviolet absorber may include 2-(2-hydroxy-5-methylphenyl)-2H-benzotriazole, 2-(3-tert-butyl-2-hydroxy-5-methylphenyl)-5-chloro-2H-benzotriazole, 2-(3,5-di-tert-butyl-2-hydroxyphenyl)-5-chloro-2H-benzotriazole, 2-(3,5-di-tert-butyl-2-hydroxyphenyl)-2H-benzotriazole, 5-chloro-2-(3,5-di-tert-butyl-2-hydroxyphenyl)-2H-benzotriazole, 2-(3,5-di-tert-amyl-2-hydroxyphenyl)-2H-benzotriazole, 2-(2-hydroxy-5-tert-octylphenyl)-2H-benzotriazole, 2-(2-hydroxy-4-octylphenyl)-2H-benzotriazole, 2-(2H-benzotriazol-2-yl)-4-methyl-6-(3,4,5,6-tetrahydrophthalimidylmethyl)phenol, and 2,2'-methylenebis[4-(1,1,3,3-tetramethylbutyl)-6-[(2H-benzotriazol-2-yl)phenol]].

The amount of the ultraviolet absorber is usually 0.01 parts by weight or more, preferably 0.02 parts by weight or more, and more preferably 0.04 parts by weight or more, and is usually 1 part by weight or less, preferably 0.5 parts by weight or less, and more preferably 0.3 parts by weight or less, with respect to 100 parts by weight of the styrene-based thermoplastic elastomer. When the ultraviolet absorber is used in an amount equal to or more than the lower limit of this range, light resistance can be improved. When the ultraviolet absorber is used in an excessive amount exceeding the upper limit, further improvement is hardly achieved.

Examples of the antioxidant may include a phosphorous-based antioxidant, a phenol-based antioxidant, and a sulfur-based antioxidant. A phosphorous-based antioxidant that suppresses coloring is preferable.

Examples of the phosphorous-based antioxidant may include monophosphite-based compounds such as triphenylphosphite, diphenylisodecylphosphite, phenyldiisodecylphosphite, tris(nonylphenyl)phosphite, tris(dinonylphenyl)phosphite, tris(2,4-di-tert-butylphenyl)phosphite, and 10-(3,5-di-tert-butyl-4-hydroxybenzyl)-9,10-dihydro-9-oxa-10-phosphaphenanthrene-10-oxide; diphosphite-based compounds such as 4,4'-butylidene-bis(3-methyl-6-tert-butylphenyl-di-tridecylphosphite) and 4,4'-isopropylidene-bis(phenyl-di-alkyl(C12-C15)phosphite); and compounds such as 6-[3-(3-tert-butyl-4-hydroxy-5-methylphenyl)propoxy]-2,4,8,10-tetrakis-tert-butyldibenz[d,f][1.3.2]dioxaphosphepine and 6-[3-(3,5-di-tert-butyl-4-hydroxyphenyl)propoxy]-2,4,8,10-tetrakis-tert-butyldibenz[d,f][1.3.2]dioxaphosphepine.

Examples of the phenol-based antioxidant may include compounds such as pentaerythrityl tetrakis[3-(3,5-di-tert-butyl-4-hydroxyphenyl)propionate], 2,2-thio-diethylenebis[3-(3,5-di-tert-butyl-4-hydroxyphenyl)propionate], octadecyl-3-(3,5-di-tert-butyl-4-hydroxyphenyl)propionate, 3,9-bis{2-[3-(3-tert-butyl-4-hydroxy-5-methylphenyl)propionyloxy]-1,1-dimethylethyl}-2,4,8,10-tetraoxaspiro[5,5]undecane, and 1,3,5-trimethyl-2,4,6-tris(3,5-di-tert-butyl-4-hydroxybenzyl)benzene.

Examples of the sulfur-based antioxidant may include compounds such as dilauryl-3,3'-thiodipropionate, dimyristyl-3,3'-thiodipropionate, distearyl-3,3'-thiodipropionate, laurylstearyl-3,3'-thiodipropionate, pentaerythritol-tetrakis(β-lauryl-thio-propionate), and 3,9-bis(2-dodecylthioethyl)-2,4,8,10-tetraoxaspiro[5,5]undecane.

The amount of the antioxidant is usually 0.01 parts by weight or more, preferably 0.05 parts by weight or more, and more preferably 0.1 parts by weight or more, and is usually 1 part by weight or less, preferably 0.5 parts by weight or less, and more preferably 0.3 parts by weight or less, with respect to 100 parts by weight of the styrene-based thermoplastic elastomer. When the antioxidant is used in an amount equal to or more than the lower limit of this range, thermal stability can be improved. When the antioxidant is used in an excessive amount exceeding the upper limit, further improvement is hardly achieved.

Examples of the method of mixing the styrene-based thermoplastic elastomer and the optional component may include a method in which the optional component is dissolved in an appropriate solvent, and mixed in a solution of the styrene-based thermoplastic elastomer, and the solvent is then removed to collect a styrene-based thermoplastic elastomer resin containing the optional component; and a method in which the styrene-based thermoplastic elastomer is brought into a molten state using a biaxial kneader, a roller, Brabender, an extruder, or the like, and is kneaded with the optional component.

The styrene-based thermoplastic elastomer resin is not necessarily limited to a styrene-based thermoplastic elastomer resin having high transparency. However, in order to obtain the composite gas barrier layered body that is useful for use in a portion that is required to transmit light in an organic EL element, it is preferable that the styrene-based thermoplastic elastomer resin has high transparency. For example, it is preferable that the total light transmittance of the styrene-based thermoplastic elastomer resin measured using a test piece having a thickness of 1 mm is usually 70% or more, preferably 80% or more, and more preferably 90% or more.

The thickness of the heat-melting layer is preferably 3 μm or more, more preferably 5 μm or more, and particularly preferably 10 μm or more, and is preferably 150 μm or less, more preferably 100 μm or less, and particularly preferably 50 μm or less. When the thickness of the heat-melting layer is equal to or more than the lower limit of the range, a film of the heat-melting resin can be produced by an extrusion method. Even if the heat-melting layer is contaminated with a small foreign substance, the heat-melting layer having a thickness of this level can be prevented from being made nonuniform due to the foreign substance. When the thickness is equal to or less than the upper limit, deflection after bonding can be suppressed to form a uniform composite gas barrier layered body, and the thickness of the composite gas barrier layered body can be decreased.

The glass transition temperature of the heat-melting layer, that is, the glass transition temperature of the heat-melting resin constituting the heat-melting layer is lower than the glass transition temperature of the alicyclic polyolefin resin constituting the film (a) and the film (b). Specifically, when the glass transition temperature of the heat-melting resin constituting the heat-melting layer is denoted by TgA, and the glass transition temperature of the alicyclic polyolefin resin constituting the film (a) and the film (b) is denoted by TgB, TgB−TgA is 25° C. or higher, and preferably 40° C. or higher. The upper limit of the value of TgB−TgA is not particularly limited, and may be, e.g., 120° C. or lower. The glass transition temperature (Tg) of the film (a) and the film (b) may be measured by differential scanning calorimetry (DSC). The glass transition temperature of the heat-melting layer may be measured in accordance with JIS K7121 using a viscoelasticity measurement device ARES-2KFRTN1E-FCO-SG-STD manufactured by Rheometric Scientific F E Ltd. When a resin containing a block copolymer is used as the heat-melting resin, the resin may have a plurality of glass transition temperatures. In this case, it is preferable that the preferable condition is satisfied when TgA is defined as the highest glass transition temperature of the resin. When the glass transition temperature of the alicyclic polyolefin resin constituting the film (a) and the glass transition temperature of the alicyclic polyolefin resin constituting the film (b) are different from each other, it is preferable that the preferable conditions are satisfied when TgB is the lower glass transition temperature among them. When the glass transition temperature of the heat-melting resin and the glass transition temperature of the alicyclic polyolefin resin constituting the film (a) and the film (b) satisfy the preferable condition, occurrence of fluctuation of optical properties (Re, etc.) of the film (a) and the film (b) can be easily reduced in the thermal compression-bonding step in production of the composite gas barrier layered body, and a high-quality composite gas barrier layered body can be easily produced.

The heat-melting layer is prepared as a long-length film. The film may be used in production of the composite gas barrier layered body. The method for producing the film of the heat-melting resin is not particularly limited. For example, any of a melt molding method and a solution casting method may be used. The melt molding method may be specifically classified into, e.g., an extrusion molding method, a press molding method, an inflation molding method, an injection molding method, a blow molding method, and a stretch molding method. Among these methods, the extrusion molding method, the inflation molding method, and the press molding method are preferable since the film that has excellent mechanical strength and surface precision can be obtained, and the extrusion molding method is particularly preferable since the film can be efficiently and simply produced. Immediately after extrusion molding, the film may be laminated with the gas barrier layered body (A) or the film (b) with nipping, whereby a thin heat-melting layer can be formed.

[5. Optional layer]

In addition to the aforementioned components, the composite gas barrier layered body may have an optional component, if necessary.

For example, a blocking preventing layer may be formed on an outside surface of the composite gas barrier layered body. When the blocking preventing layer is formed, blocking of the composite gas barrier layered body can be prevented. In addition, the surface of the composite gas barrier layered body can be protected during storage or transportation of the composite gas barrier layered body. The blocking preventing layer may be formed by, e.g., a method of coating with a release agent such as a silicone-based release agent, a long-chain alkyl-based release agent, a fluorine-containing release agent, and molybdenum sulfide; a method of forming a resin layer containing a lubricant such as inert particles; or the like.

The outside surface of the composite gas barrier layered body usually corresponds to a surface of the film (a) opposite to the inorganic barrier layer (a) and a surface of the film (b) opposite to the heat-melting layer. Therefore, the blocking preventing layer is usually formed on the surface of the film (a) opposite to the inorganic barrier layer (a) or the surface of the film (b) opposite to the heat-melting layer. Herein, blocking is prone to occur prior to another layer is formed on the surface of the film (a) or the film (b). Therefore, it is preferable that the blocking preventing layer is performed prior to a step of forming the inorganic barrier layer (a) or the heat-melting layer on the surface of the film (a) or the film (b).

The composite gas barrier layered body may have, e.g., an antistatic layer, a hardcoat layer, a conductivity-imparting layer, a pollution preventing layer, a concavo-convex structure layer, and the like. Among them, the conductivity-imparting layer may be formed by patterning through printing or etching. Such an optional layer may be formed by, e.g., a method of applying a material for the optional layer onto the film (a) or the film (b), followed by curing; or a thermal compression bonding method.

[6. Physical Properties of Composite Gas Barrier Layered Body]

The water vapor permeability of the composite gas barrier layered body as its entirety is preferably $5 \times 10^{-2}$ g/m$^2$·day or less, and more preferably $2 \times 10^{-3}$ g/m$^2$·day or less. The lower limit thereof is ideally zero, but is practically $1 \times 10^{-6}$ g/m$^2$·day or more. Such a water vapor permeability can be achieved by appropriately selecting the materials and the thicknesses of the inorganic layer and the other layers.

The composite gas barrier layered body is flexible and has excellent bendable property. For this reason, even when the composite gas barrier layered body is bent, a crack does not easily occur. Therefore, the gas barrier property is not easily reduced by external force. Particularly, even when the composite gas barrier layered body is bent many times, the gas barrier property is not easily deteriorated. Specifically, even when the composite gas barrier layered body is subjected to a bending test 250 times at a bending diameter Φ of 25.4 mm, the water vapor permeability can be usually confined within a low range as described above. In addition, even when the composite gas barrier layered body is placed under a low-pressure environment, the amount of outgas to be generated is usually small. Thus, the composite gas barrier layered body has high gas barrier property, and the gas barrier property can be favorably maintained under a high-temperature or low-pressure environment. Therefore, the composite gas barrier layered body has excellent weather resistance.

The composite gas barrier layered body does not easily cause curling. Therefore, the curl amount that is determined by the following measurement method can be usually decreased to 1 mm or less.

Herein, the curl amount may be measured by the following method. A sample is first punched into a 5-cm square. The punched sample piece is disposed on a horizontal board. At this time, the sample piece is disposed so that a concave curl formed is vertically upward. Distances of four points at corners of the disposed sample piece from the board are measured. The average value of the measured distances at the four points is calculated as the curl amount.

In the composite gas barrier layered body, the adhesion force between the gas barrier layered body (A) and the film (b) that is the adhesion force immediately after production is preferably 1.0 N/cm or more, and more preferably 2.0 N/cm or more.

The transparency of the composite gas barrier layered body is not particularly limited. However, from the viewpoint of configuring the composite gas barrier layered body as a useful product for use in a portion required to transmit light in an organic EL element, the total light transmittance of the composite gas barrier layered body is preferably 70% or more, more preferably 80% or more, and particularly preferably 90% or more.

The haze of the composite gas barrier layered body as its entirety is not particularly limited. When the composite gas barrier layered body is used for an optical use in which light diffusion is not especially intended, it is generally preferable that the haze is lower. The haze is preferably 3.0% or less, and more preferably 1.0% or less.

The thickness of the composite gas barrier layered body of the present invention as its entirety is preferably 20 µm or more, and more preferably 50 µm or more, and is preferably 300 µm or less, and more preferably 100 µm or less. Particularly, the composite gas barrier layered body that is as thin as the total thickness of 100 µm or less and includes the film (b) having a thickness of 30 µm or less can favorably achieve the effects of the present application in which the bendable property is excellent and a reduction in the gas barrier performance during bending is reduced.

[7. Method for Producing Composite Gas Barrier Layered Body]

The composite gas barrier layered body may be produced by any method. The composite gas barrier layered body may be usually produced by preparing the gas barrier layered body (A) and the film (b), and integrating them via the heat-melting resin. Specific examples thereof may include the following production methods (i), (ii), and (iii). The production method (ii) is a method in which a film (C) of the heat-melting resin is formed by an extrusion molding method, and a thermal compression-bonding step in a production method (i) is divided into two steps. According to the production method (ii), a thin heat-melting resin can be formed.

Production method (i): A production method including a step of forming the inorganic barrier layer (a) directly on at least one surface of the film (a) to obtain the gas barrier layered body (A), and a step of stacking the gas barrier layered body (A), the film (b), and a film (c) of the heat-melting resin so that the film (a), the inorganic barrier layer (a), the film (c), and the film (b) are stacked in this order, and thermally compression-bonding the stack.

Production method (ii): A production method including a step of forming the inorganic barrier layer (a) directly on at least one surface of the film (a) to obtain the gas barrier layered body (A), a step of thermally compression-bonding the heat-melting resin layer to a surface of the gas barrier layered body (A) on the side of the inorganic barrier layer (a) or the film (b) by a nip roll immediately after the heat-melting resin extrusion-molded, and a step of stacking the gas barrier layered body (A) or the film (b) with the heat-melting layer thermally compression-bonded thereto, and the gas barrier layered body (A) or the film (b) that does not have the heat-melting layer so that the film (a), the inorganic barrier layer (a), the heat-melting layer, and the film (b) are stacked in this order, and thermally compression-bonding the stack.

Production method (iii): A production method including a step of forming the inorganic barrier layer (a) directly on at least one surface of the film (a) to obtain the gas barrier layered body (A), a step of applying a liquid heat-melting resin onto a surface of the gas barrier layered body (A) on the side of the inorganic barrier layer (a), one surface of the film (b), or both these surfaces, and drying it, as necessary, to form the heat-melting layer, and a step of stacking the gas barrier layered body (A) and the film (b) (one or both of them further has the heat-melting layer) so that the film (a), the inorganic barrier layer (a), the heat-melting layer, and the film (b) are stacked in this order, and thermally compression-bonding the stack.

In the following description for the production method, the production method (i) will be described as the production method of the present invention.

With the production method (i), bonding can be easily performed since the gas barrier layered body (A) and the film (b) are bonded via the film (c) of the heat-melting resin. For example, when the gas barrier layered body (A) and the film (b) are bonded via a fluid adhesive, it is difficult to uniformly bond the gas barrier layered body (A) and the film (b). This is because each of the gas barrier layered body (A) alone and the film (b) alone easily causes curling. On the other hand, when a film-shaped film of the heat-melting resin is used for bonding, the bonding is facilitated, and the composite gas barrier layered body can be stably produced.

The method for forming the inorganic barrier layer (a) on the surface of the film (a) is as described in the section of inorganic barrier layer (a). The gas barrier layered body (A) is usually produced as a long-length film, and wound up into a roll shape for use in the subsequent step.

Figure 2:
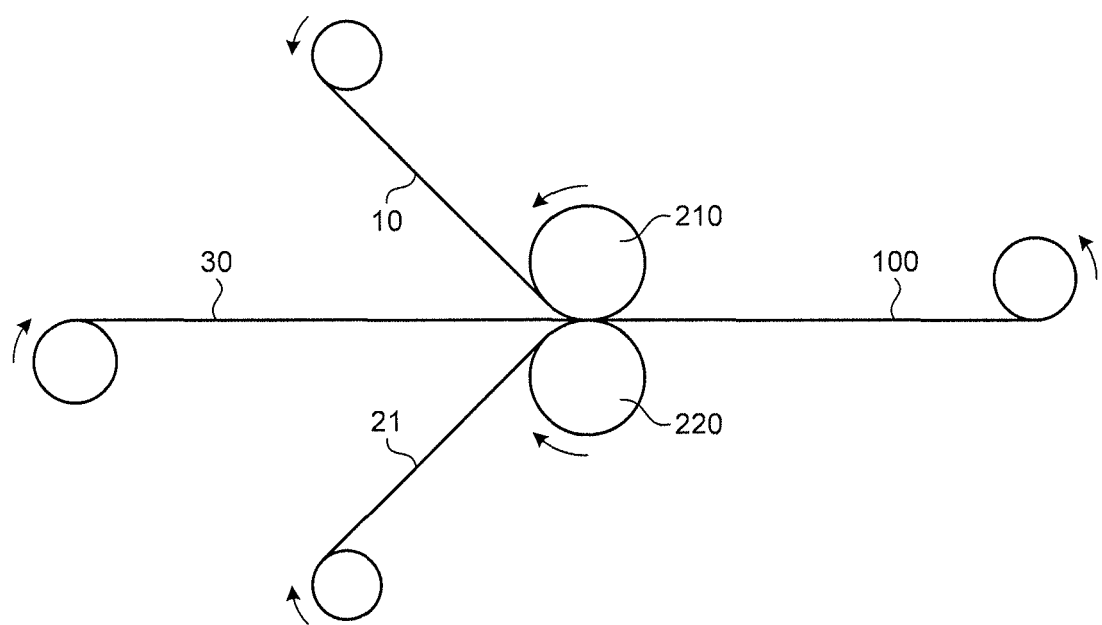
FIG. 2 is a side view schematically illustrating a step of thermally compression-bonding a gas barrier layered body (A), a film (b), and a film (c) of a heat-melting resin in a method for producing a composite gas barrier layered body according to an embodiment of the present invention.

FIG. 2 is a side view schematically illustrating a step of thermally compression-bonding the gas barrier layered body (A) 10, the film (b) 21, and the film (c) of the heat-melting resin in the method for producing the composite gas barrier layered body 100 according to an embodiment of the present invention. The film (c) of the heat-melting resin herein corresponds to the same member as the aforementioned heat-melting layer 30, and will be described using the same symbol "30".

As shown in FIG. 2, the gas barrier layered body (A) 10, the film (b) 21, and the film (c) 30 of the heat-melting resin are unrolled from each roll, and thermally compression-bonded by, e.g., pressure rollers 210 and 220 capable of controlling the temperature. At this time, the gas barrier layered body (A) 10 is placed in such a direction that the surface on the side of the inorganic barrier layer (a) faces to the film (c) 30. Since the heat-melting resin serves as an adhesive, the gas barrier layered body (A) 10 is bonded to the film (b) 21 to obtain the composite gas barrier layered body 100. The resulting composite gas barrier layered body 100 is wound up and stored in a roll shape. When the composite gas barrier layered body 100 is thus produced by a roll-to-roll method, the productivity can be further enhanced.

The temperature during thermal compression-bonding depends on the temperature at which the film (c) of the heat-melting resin expresses flowability, but is usually 70° C. or higher, and preferably 80° C. or higher. Thus, the gas barrier layered body (A) and the film (b) can be stably bonded to each other. The upper limit of the temperature is usually 250° C. or lower, and preferably equal to or lower than the glass transition temperature Tg° C. of the alicyclic polyolefin resin that forms the film (a) and the film (b). In particular, when the temperature at which the film (c) of the heat-melting resin expresses flowability is set to be equal to or lower than the glass transition temperature Tg of the alicyclic polyolefin resin and thermal compression-bonding is performed at a temperature equal to or lower than Tg, deformation due to heat of the film (a) and the film (b), thermal shrinking before and after a pressurization and compression-bonding process, and degradation can be prevented.

The pressure applied by the pressure rollers during thermal compression-bonding is usually 0.1 MPa or more. Thereby the gas barrier layered body (A) and the film (b) can be stably bonded to each other. The upper limit of the pressure is usually 1.5 MPa or less, and preferably 1.0 MPa or less. Thereby occurrence of a crack in the inorganic barrier layer (a) by excess pressure can be prevented.

When the gas barrier layered body (A), the film (b), and the film (c) of the heat-melting resin are prepared as long-length films and the long-length films are thermally compression-bonded while they are conveyed through a line, the line speed during conveyance is usually 0.1 m/min or more, preferably 0.2 m/min or more, and more preferably 0.3 m/min or more, and is 5 m/min or less, preferably 3 m/min or less, and more preferably 2 m/min or less. When the line speed is equal to or more than the lower limit of the range, efficient production is possible. When the line speed is equal to or less than the upper limit, the gas barrier layered body (A) and the film (b) can be stably bonded to each other.

[8. Application of Composite Gas Barrier Layered Body]

The composite gas barrier layered body of the present invention may be used as a component of an organic EL element. Specifically, the composite gas barrier layered body may be used as a film of sealing another component constituting the organic EL element for protection against moisture and oxygen. When the composite gas barrier layered body has a function of a ¼ λ wave plate in addition to a gas barrier function, the composite gas barrier layered body as the ¼ λ wave plate in the organic EL element may be combined with another optical member to constitute a layer exerting an optical function. For example, the composite gas barrier layered body as the ¼λ wave plate may be combined with a linear polarizing plate to constitute an anti-reflective film.

Figure 3:
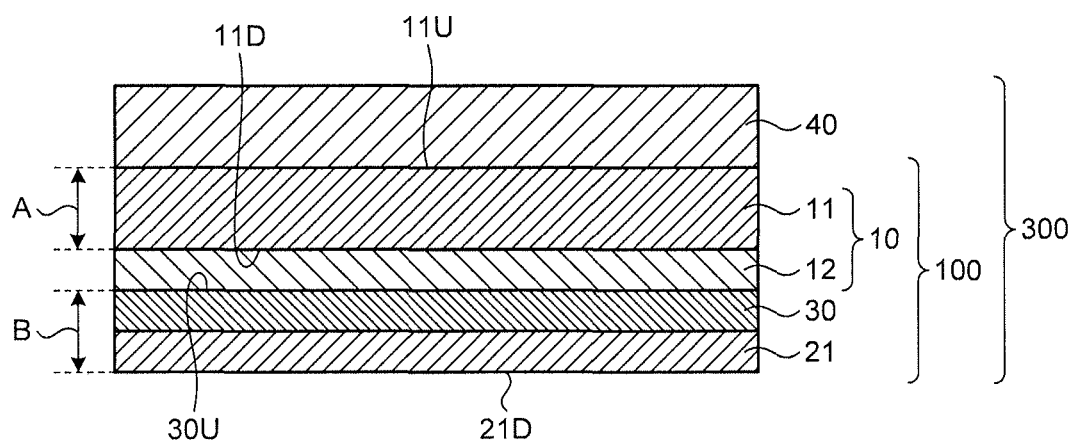
FIG. 3 is a cross-sectional view schematically illustrating a cross section of an anti-reflective film using a composite gas barrier layered body according to an embodiment of the present invention, the cross section being obtained by cutting along a plane perpendicular to a principal plane of the film.

FIG. 3 is a cross-sectional view schematically illustrating a cross section of an anti-reflective film using the composite gas barrier layered body according to an embodiment of the present invention, the cross section being obtained by cutting along a plane perpendicular to a principal plane of the film. As shown in FIG. 3, an anti-reflective film 300 has the composite gas barrier layered body 100 and a linear polarizing plate 40 that is formed on one outside surface 11U of the composite gas barrier layered body 100. In FIG. 3, the same portions as shown in FIG. 1 are denoted by the same symbols as in FIG. 1.

When the anti-reflective film 300 obtained by thus combining the composite gas barrier layered body 100 with the linear polarizing plate 40 is placed on a light-emitting surface of the organic EL element so that the linear polarizing plate face the side of the light-emitting surface, reflection of external light image on the light-emitting surface can be prevented. Specifically, when natural light that is unpolarized light enters an organic EL display device provided with the anti-reflective film having such a configuration, light of a linear polarizing component having a vibration direction parallel to the transmission axis of the linear polarizing plate passes through the linear polarizing plate 40, and another light is absorbed by the linear polarizing plate 40. When the light having passed through the linear polarizing plate 40 passes through the composite gas barrier layered body 100 functioning as a ¼ wave plate, the linearly polarized light is transformed into circularly polarized light. The circularly polarized light then reflects from another layer of the organic EL element, passes through a ¼ composite gas barrier layered body 100, is transformed into linearly polarized light, and then enters the linear polarizing plate 40. At this time, this light enters the linear polarizing plate 40 with decreased linearly polarized light having a vibration direction parallel to the transmission axis of the linear polarizing plate 40. For this reason, most part of this light is absorbed by the linear polarizing plate 40. Therefore, the reflection of external light can be prevented by the anti-reflective film 300. Further, the composite gas barrier layered body 100 can exert a sealing function. Therefore, the anti-reflective film 300 may be used as a member having both an anti-reflection function and a sealing function.

EXAMPLES

The present invention will be specifically described hereinbelow with reference to Examples. However, the present invention is not limited to the following Examples. The present invention may be optionally modified for implementation within the scope not departing from the claims of the present invention and equivalents thereto.

In the following description, "%" and "part(s)" that represent an amount are based on weight unless otherwise specified. Operations described below were performed under conditions of normal temperature and normal pressure unless otherwise specified.

[Measurement Method]

(1. Method for Measuring Curl Amount)

A sample was punched into a 5-cm square. The punched sample piece was disposed on a horizontal board. At this time, the sample piece was disposed so that a concave curl formed was vertically upward. Distances of four points at corners of the disposed sample piece from the board were measured. The average value of the measured distances at the four points was calculated as the curl amount.

(2. Method for Measuring Water Vapor Permeability)

Using a differential pressure-type measurement device having a circular measurement area with a diameter of 8 cm, the pressure of water vapor corresponding to 90% RH at 40° C. was applied at both sides of the sample, and the water vapor permeability was measured.

Example 1

(1-1. Layered Body (A1) and Film (b1))

A roll-shaped alicyclic polyolefin resin film (a1) (film containing a norbornene polymer, ZEONOR film ZF16 available from ZEON Corporation, thickness: 100 µm, Re: 5 nm, Tg: 163° C.) was unrolled, and on one surface of the film, a SiOC film having a thickness of 1 µm was formed using a plasma CVD device, to obtain a gas barrier layered body (A1). The resulting gas barrier layered body (A1) had a curl with a curl amount of 14 mm.

A roll-shaped film (b1) (film containing a norbornene polymer, ZEONOR film ZD16 available from ZEON Corporation, thickness: 40 µm, Re: 140 nm, Tg: 163° C.) was separately prepared.

(1-2. Film (c) of Heat-Melting Resin)

A film of a styrene-isoprene-styrene copolymer having a thickness of 50 µm and Tg of 120° C. was prepared as a film (c) of a heat-melting resin.

The styrene-isoprene-styrene copolymer was a polymer obtained by hydrogenating an aromatic vinyl compound-conjugated diene block copolymer produced using styrene as an aromatic vinyl compound and isoprene as a linear conjugated diene copolymer, followed by modification with vinyltrimethoxysilane, and had a triblock structure in which polymer blocks [A] were bonded to both terminals of a polymer block [B]. This styrene-isoprene-styrene copolymer had a weight average molecular weight (Mw) of 48,000. The ratio by weight of the polymer blocks "wA/wB" was 50/50, the ratio of weight average molecular weight of the polymer block [A] "Mw(A1)/Mw(A2)" was 1.1, and the hydrogenation ratio was 99.9%.

(1-3. Thermal Compression-Bonding)

The gas barrier layered body (A1) and the film (b1) obtained in the process (1-1) were disposed so that the SiOC film faced the side of the film (b1), and the heat-melting resin film (c) obtained in the process (1-2) was disposed between the gas barrier layered body (A1) and the film (b1). The gas barrier layered body (A1), the film (c), and the film (b1) that were thus stacked were conveyed in a lengthwise direction while they were pressurized from both sides by a pair of opposed resin rollers. At this time, the temperature of the resin rollers was adjusted to 140° C.

The line speed during conveyance was set to 0.3 m/min. The pressurization strength applied by the resin rollers was set to 0.1 MPa. Thus, the gas barrier layered body (A1), the film (c), and the film (b1) were thermally compression-bonded, to obtain a composite gas barrier layered body having a layer structure of alicyclic polyolefin resin film (a1)-SiOC film-heat-melting layer-alicyclic polyolefin resin film (b1).

(1-4. Evaluation of Composite Gas Barrier Layered Body)

The curl amount and water vapor permeability of the composite gas barrier layered body obtained in the process (1-3) were measured. The curl amount was 1 mm or less and the water vapor permeability was $1.1 \times 10^{-2}$ g/m²·day.

The composite gas barrier layered body was bent at a bending diameter $\Phi$ of 25.4 mm. The state of the bent portion was visually observed. Occurrence of a crack was not observed.

The obtained composite gas barrier layered body was placed in a chamber having a volume of 100 cm³, and air was exhausted from the chamber with a vacuum pump ("GHD-030" manufactured by ULVAC, Inc.). After about 18 hours, the pressure in the chamber reached $1 \times 10^{-4}$ torr.

The obtained composite gas barrier layered body was subjected to a bending test 250 times at a bending diameter $\Phi$ of 25.4 mm. After that, the water vapor permeability was measured. The water vapor permeability was $1.3 \times 10^{-2}$ g/m²·day, which was not largely changed from that before the bending test.

Re was observed and found to be entirely uniform.

Example 2

(2-1. Layered Body (A2) and Film (b2))

A roll-shaped alicyclic polyolefin resin film (a2) (film containing a norbornene polymer, ZEONOR film ZD16 available from ZEON Corporation, thickness: 40 µm, Re: 140 nm, Tg: 163° C.) was unrolled, and on one surface of the film, a SiOC film having a thickness of 1 µm was formed using a plasma CVD device, to obtain a gas barrier layered body (A2). The resulting gas barrier layered body (A2) had a curl with a curl amount of 16 mm.

A roll-shaped film (b2) (film containing a norbornene polymer, ZEONOR film ZF16 available from ZEON Corporation, thickness: 25 µm, Re: 20 nm, Tg: 163° C.) was separately prepared.

(2-2. Film (c) of Heat-Melting Resin)

A film of a styrene-isoprene-styrene copolymer having a thickness of 35 µm and Tg of 120° C. was prepared as a heat-melting film (c) in the same manner as in the process (1-2) of Example 1.

(2-3. Thermal Compression-Bonding)

The gas barrier layered body (A2) and the film (b2) obtained in the process (2-1) were disposed so that the SiOC film faced the side of the film (b2), and the heat-melting resin film (c) obtained in the process (2-2) was disposed between the gas barrier layered body (A2) and the film (b2). The gas barrier layered body (A2), the film (c), and the film (b2) that were thus stacked were conveyed in a lengthwise direction while they were pressurized from both sides by a pair of opposed resin rollers under the same conditions as those for the thermal compression-bonding in the process (1-3) of Example 1. Thus, the gas barrier layered body (A2), the film (c), and the film (b2) were thermally compression-bonded, to obtain a composite gas barrier layered body having a layer structure of alicyclic polyolefin resin film (a2)-SiOC film-heat-melting layer-alicyclic polyolefin resin film (b2).

(2-4. Evaluation of Composite Gas Barrier Layered Body)

The curl amount and water vapor permeability of the composite gas barrier layered body obtained in the process (2-3) were measured. The curl amount was 1 mm or less and the water vapor permeability was $1.0 \times 10^{-2}$ g/m$^2$·day.

The composite gas barrier layered body was bent at a bending diameter Φ of 25.4 mm in the same manner as in the process (1-4) of Example 1. The composite gas barrier layered body was more easily bent as compared with Example 1, and high bendable property was thus confirmed. The state of the bent portion was visually observed. Occurrence of a crack was not observed.

The obtained composite gas barrier layered body was placed in a chamber having a volume of 100 cm$^3$, and air was exhausted from the chamber with a vacuum pump ("GHD-030" manufactured by ULVAC KIKO, Inc.). After about 18 hours, the pressure in the chamber reached $1 \times 10^{-4}$ torr.

The obtained composite gas barrier layered body was subjected to a bending test 250 times at a bending diameter Φ of 25.4 mm. After that, the water vapor permeability was measured. The water vapor permeability was $1.3 \times 10$ g/m$^2$·day, which was not largely changed from that before the bending test.

Re was observed and found to be entirely uniform.

Comparative Example 1

A solvent-free acrylic UV-curable resin (trade name "DAIOLET PS3A" available from Daido Chemical Corporation) was applied onto a surface of a film (b1) that was the same as one prepared in the process (1-1) of Example 1 to form a layer of the UV-curable resin having a thickness of 50 μm. A gas barrier layered body (A1) that was the same as one prepared in the process (1-1) of Example 1 was stacked thereon so that a SiOC film faced the side of the UV-curable resin layer. The gas barrier layered body (A1), the UV-curable resin layer, and the film (b1) that were thus stacked were irradiated with ultraviolet light at 500 mJ to bond the gas barrier layered body (A1), the UV-curable resin layer, and the film (b1). Thus, a composite gas barrier layered body having a layer structure of alicyclic polyolefin resin film (a1)-SiOC film-UV-curable resin layer-alicyclic polyolefin resin film (b1) was obtained. The obtained composite gas barrier layered body was bent at a bending diameter Φ of 25.4 mm in the same manner as in Example 1. A crack easily occurred.

Comparative Example 2

An acrylic adhesive sheet ("CS9621" available from Nitto Denko Corporation, thickness: 25 μm) was bonded to a surface of a film (b1) that was the same as one prepared in the process (1-1) in Example 1 two times, to form a layer of the adhesive sheets having a thickness of 50 μm. A gas barrier layered body (A1) that was the same as one prepared in the process (1-1) in Example 1 was stacked thereon so that a SiOC film faced the side of the adhesive sheet layer. The gas barrier layered body (A1), the adhesive sheet layer, and the film (b1) that were thus stacked were conveyed in a lengthwise direction while they were pressurized from both sides by a pair of opposed resin rollers under the same conditions as those for the thermally compression-bonding in the process (1-3) of Example 1. Thus, the gas barrier layered body (A1), the adhesive sheet layer, and the film (b1) were thermally compression-bonded, to obtain a composite gas barrier layered body having a layer structure of alicyclic polyolefin resin film (a1)-SiOC film-adhesive sheet layer-alicyclic polyolefin resin film (b1).

The curl amount and water vapor permeability of the composite gas barrier layered body obtained were measured. The curl amount was 1 mm or less and the water vapor permeability was $1.1 \times 10^{-2}$ g/m$^2$·day. The composite gas barrier layered body was placed in a chamber, and air was exhausted from the chamber with a vacuum pump by the same operation as the operation performed in the process (1-4) of Example 1. Even after about 18 hours, the pressure in the chamber was $3 \times 10^{-4}$ torr, and vacuum exhaustion took time.

Comparative Example 3

A composite gas barrier layered body was produced in the same manner as in the processes (1-1) to (1-3) of Example 1 except that in the process (1-1) a film having Tg of 136° C. (film containing a norbornene polymer, ZEONOR film ZF14 available from ZEON Corporation, thickness: 100 μm, Re: 3 nm) was used as a film (a1) of an alicyclic polyolefin resin and a film having Tg of 136° C. (film containing a norbornene polymer, ZEONOR film ZD14 available from ZEON Corporation, thickness: 40 μm, Re: 140 nm) was used as a film (b1).

Re of the produced composite gas barrier layered body was observed. Unevenness of Re occurred during thermal compression bonding in the process (1-3). Re of the uneven part was measured and found to be decreased by 3 nm or more.

Comparative Example 4

A composite gas barrier layered body was produced in the same manner as in Comparative Example 3 except that the temperature of the resin rollers was set to 120° C. in the process (1-3).

The obtained composite gas barrier layered body was observed. Adhesion between the SiOC layer and the heat-melting layer, and adhesion between the film (b) and the heat-melting layer were insufficient, and the composite gas barrier layered body was clouded in white.

<Discussion>

In the composite gas barrier layered bodies obtained in Examples 1 and 2, the curl amount is small. The bendable property in Example 2 is excellent. This shows that the present invention can achieve a composite gas barrier layered body that has low tendency to cause curling.

In Comparative Example 1, a crack easily occurred by bending and the gas barrier property were impaired. In Comparative Example 2, a gas was generated from the composite gas barrier layered body under a low-pressure environment, and as a result, the gas barrier property were reduced. In Comparative Examples 3 and 4, the values of Re changed and the adhesion was impaired. In contrast, in the composite gas barrier layered bodies obtained in Examples 1 and 2, a reduction in gas barrier property under a high-temperature environment, occurrence of a crack by bending, and generation of a gas from the composite gas barrier layered bodies themselves were suppressed. This shows that the present invention can achieve a composite gas barrier layered body that is flexible, has excellent bendable property, and is readily capable of maintaining favorable gas barrier property.

DESCRIPTION OF NUMERALS

10: gas barrier layered body (A)
11: film (a)
12: inorganic barrier layer (a)
21: film (b)
30: heat-melting layer, or film of heat-melting layer (film (c))
40: linear polarizing plate
100: composite gas barrier layered body
210, 220: pressure roller
300: anti-reflective film

The invention claimed is:

1. A composite gas barrier layered body for an organic electroluminescent light-emitting element, consisting of:
   a gas barrier layered body (A) having a film (a) of an alicyclic polyolefin resin and one or more inorganic barrier layers (a) directly provided on at least one surface of the film (a);
   a film (b) formed of an alicyclic polyolefin resin having a thickness that is equal to less than a thickness of the film (a); and
   a heat-melting layer that is interposed between the inorganic barrier layer (a) and the film (b) to bond the inorganic barrier layer (a) to the film (b), wherein
   a difference (TgB−TgA) between a glass transition temperature TgA of the heat-melting layer and a glass transition temperature TgB of the alicyclic polyolefin resin constituting the film (a) and the film (b) is 25° C. or higher,
   a ratio of the thickness of the film (a) relative to the thickness of the film (b) is from 10:9 to 3:1,
   a thickness of the heat-melting layer is 3 μm or more and 50 μm or less, and
   the heat-melting layer is
       a layer of a styrene-based thermoplastic elastomer resin,
       a layer of an olefin-based thermoplastic elastomer resin,
       a layer of a vinyl chloride-based thermoplastic elastomer resin,
       a layer of a polyester-based thermoplastic elastomer resin, or
       a layer of a urethane-based thermoplastic elastomer resin.

2. The composite gas barrier layered body according to claim 1, wherein
   the styrene-based thermoplastic elastomer resin contains a styrene-conjugated diene block copolymer hydride.

3. The composite gas barrier layered body according to claim 1, wherein
   any one of the film (a) and the film (b) has a retardation in an in-plane direction at a wavelength of 550 nm of 115 to 160 nm, and the other has a retardation in an in-plane direction at a wavelength of 550 nm of 0 to 25 nm.

4. The composite gas barrier layered body according to claim 1, wherein
   the film (b) has a thickness of 30 μm or less, and the composite gas barrier layered body has a thickness of 100 μm or less.

5. The composite gas barrier layered body according to claim 1, wherein the heat-melting layer comprises a layer of a hydride of an aromatic vinyl compound-conjugated diene block copolymer, and
   the hydride has an alkoxysilyl group.

6. The composite gas barrier layered body according to claim 5, wherein the hydride is a substance obtained by hydrogenation of a carbon-carbon unsaturated bond in a main chain and a side chain and a carbon-carbon unsaturated bond in an aromatic ring of the aromatic vinyl compound-conjugated diene block copolymer.

7. A method for producing a composite gas barrier layered body, comprising steps of:
   forming an inorganic barrier layer (a) directly on at least one surface of a film (a) of an alicyclic polyolefin resin to obtain a gas barrier layered body (A); and
   stacking the gas barrier layered body (A), a film (b) of an alicyclic polyolefin resin having a thickness that is less than a thickness of the film (a), and a film (c) of a heat-melting resin so that the film (a), the inorganic barrier layer (a), the film (c), and the film (b) are stacked in this order, and thermally compression-bonding the stack by pressure rollers so that one of the pressure rollers is in contact with the surface of the film (b), wherein
   a difference (TgB−TgA) between a glass transition temperature TgA of the heat-melting resin and a glass transition temperature TgB of the alicyclic polyolefin resin constituting the film (a) and the film (b) is 25° C. or higher,
   a ratio of the thickness of the film (a) relative to the thickness of the film (b) is from 10:9 to 3:1,
   a thickness of the heat-melting layer is 3 μm or more and 50 μm or less, and
   the heat-melting layer is
       a layer of a styrene-based thermoplastic elastomer resin,
       a layer of an olefin-based thermoplastic elastomer resin,
       a layer of a vinyl chloride-based thermoplastic elastomer resin,
       a layer of a polyester-based thermoplastic elastomer resin, or
       a layer of a urethane-based thermoplastic elastomer resin.

8. The composite gas barrier layered body according to claim 1, wherein the heat-melting layer comprises a layer of a hydride of an aromatic vinyl compound-conjugated diene block copolymer.

9. The composite gas barrier layered body according to claim 8, wherein
   the hydride comprises a hydrogenated structure of the aromatic vinyl compound-conjugated diene block copolymer wherein a carbon-carbon unsaturated bond in a main chain and a side chain is hydrogenated and a carbon-carbon unsaturated bond in an aromatic ring of the aromatic vinyl compound-conjugated diene block copolymer is hydrogenated.

* * * * *